US006740468B2

(12) United States Patent
Aoshima

(10) Patent No.: US 6,740,468 B2
(45) Date of Patent: May 25, 2004

(54) PLANOGRAPHIC PRINTING PLATE AND METHOD OF PRODUCING THE SAME

(75) Inventor: Keitaro Aoshima, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 32 days.

(21) Appl. No.: 09/904,511

(22) Filed: Jul. 16, 2001

(65) Prior Publication Data

US 2002/0048722 A1 Apr. 25, 2002

(30) Foreign Application Priority Data

Aug. 25, 2000 (JP) ...................................... 2000-255292

(51) Int. Cl.$^7$ ................................................ G03F 7/004
(52) U.S. Cl. .................................... 430/270.1; 430/302
(58) Field of Search ............................ 430/269, 270.1, 430/281.1, 284.1, 285.1, 287.1, 302

(56) References Cited

U.S. PATENT DOCUMENTS

| | | | | | |
|---|---|---|---|---|---|
| 4,857,437 | A | * | 8/1989 | Banks et al. | 430/327 |
| 5,194,365 | A | * | 3/1993 | Goodin et al. | 430/327 |
| 5,227,276 | A | * | 7/1993 | Roeschert et al. | 430/252 |
| 5,607,816 | A | | 3/1997 | Fitzgerald et al. | |
| 5,725,994 | A | * | 3/1998 | Kondo | 430/270.1 |
| 5,773,194 | A | * | 6/1998 | Hattori et al. | 430/284.1 |
| 5,853,958 | A | | 12/1998 | Cheng et al. | |
| 5,948,590 | A | * | 9/1999 | Aoshima | 430/270.1 |
| 5,965,319 | A | * | 10/1999 | Kobayashi | 430/176 |
| 6,040,113 | A | | 3/2000 | Van Damme et al. | |
| 6,042,987 | A | * | 3/2000 | Kobayashi | 430/270.1 |
| 6,063,545 | A | * | 5/2000 | Roeschert et al. | 430/280.1 |
| 6,083,658 | A | * | 7/2000 | Kunita et al. | 430/270.1 |
| 6,117,610 | A | * | 9/2000 | Sheriff et al. | 430/190 |
| 6,174,646 | B1 | * | 1/2001 | Hirai et al. | 430/302 |
| 6,242,156 | B1 | * | 6/2001 | Teng | 430/270.1 |
| 6,303,267 | B1 | | 10/2001 | Benzing et al. | |
| 6,391,519 | B1 | * | 5/2002 | Kunita | 430/270.1 |
| 6,495,310 | B2 | * | 12/2002 | Teng | 430/303 |
| 2002/0012877 | A1 | * | 1/2002 | Denzinger et al. | 430/272.1 |

FOREIGN PATENT DOCUMENTS

| | | |
|---|---|---|
| EP | 0 993 966 A1 | 4/2000 |
| EP | 1 106 348 A1 | 6/2001 |
| EP | 1 110 747 A1 | 6/2001 |
| EP | 1 129 861 A1 | 9/2001 |
| EP | 1 162 078 A2 | 12/2001 |
| EP | 1 176 007 A2 | 1/2002 |
| EP | 1 182 033 A1 | 2/2002 |
| JP | 9-34110 A | 2/1997 |
| WO | WO 00/48836 A1 | 8/2000 |

OTHER PUBLICATIONS

Machine Translation of JP 2001–042538.*

* cited by examiner

*Primary Examiner*—Mark Huff
*Assistant Examiner*—Amanda C Walke
(74) *Attorney, Agent, or Firm*—Burns, Doane, Swecker & Mathis, L.L.P.

(57) ABSTRACT

A negative planographic printing plate comprising a substrate carrying thereon a recording layer which contains a polymerizable compound and an infrared absorbing agent, and in which a polymerization reaction caused the action of light or heat decreases solubility in an alkali developer, wherein the optical density of said recording layer is from 0.4 to 2.0, and the film hardness of the upper part of said recording layer after reduction in solubility in an alkali developer due to the action of light or heat is higher than the average film hardness of the whole recording layer, and a preferable method of producing the same.

18 Claims, 2 Drawing Sheets

PLANOGRAPHIC PRINTING PLATE AND METHOD OF PRODUCING THE SAME

BACKGROUND OF THE INVENTION

1. Field of the Invention

The present invention relates to a planographic printing plate having sensitivity in an infrared wavelength region and a method of producing the same. More particularly, the present invention relates to a negative planographic printing plate which can be obtained by so-called direct plate production in which plate production can be directly effected by using infrared laser based on digital signals from computers and the like.

2. Description of the Related Art

Recently, there are remarkable developments in lasers. Particularly, solid laser and semiconductor laser which emit an infrared ray having a wavelength from 760 nm to 1200 nm (hereinafter, sometimes referred to as "infrared laser"), and show high output and have small size are easily available. These infrared lasers are very useful as a recording light source in directly producing a printing plate plates based on digital data from computers and the like. Therefore, there is, recently, increasing desire for an image recording material having high sensitivity, for such an infrared recording light source, namely, an image recording material whose solubility in a developer changes significantly due to irradiation with an infrared ray.

As such a negative image recording material which can be recorded by infrared laser, U.S. Pat. No. 5,340,699 describes a recording material composed of an infrared absorbing agent, an acid generator, resol resin and a novolak resin. However, such a negative image recording material requires, for image formation, a heating treatment after exposure with the laser. Therefore, a negative image recording material requiring no heating treatment after exposure has been desired.

Further, in a method using exposure of high power and intensity and utilizing a high output laser, an exposure region is irradiated intensively with a large amount of light energy for an exposure time of an instant. This light energy is converted efficiently into heat energy and thermal changes such as chemical changes, phase changes and, changes in form and structure are caused by this heat, and the changes are utilized for image recording. However, when the amount of an infrared absorbing agent added is increased for improvement of recording sensitivity in a recording layer of a conventional planographic printing plate, a laser exposure apparatus and a light source may become contaminated due to ablation (splashing) of the recording layer.

For achieving the two objects of improvement of image formation property and suppression of ablation, JP-A No. 11-192782 describes an image formation material having a structure containing two laminated recording layers having different functions respectively, however, this material is of positive type, and different from the present invention.

As a negative image formation material, WO 97/00777, for example, describes a negative image formation material having a photosensitive layer with a two-layer structure. However, there is a problem with this structure in that ablation tends to occur since the surface layer which is an exposure surface is photosensitive, and further, post-exposure is necessary for obtaining a strong image.

One object of the present invention is to provide a negative planographic printing plate which can manifest direct plate production by recording based on digital data from a computer and the like using solid laser and semiconductor laser emitting infrared rays, shows high sensitivity to infrared laser, suppresses ablation of a recording layer in recording, and has excellent image formation properties such as dot reproduction property and excellent printing endurance, and another object is to provide a preferable method of producing the same.

SUMMARY OF THE INVENTION

The present inventors have directed their attention to the property of a recording layer of a negative planographic printing plate which can realize direct plate production by irradiation with infrared ray and intensively studied this. As a result, they have found that the above-mentioned problems can be solved by causing the film hardness near the surface of a recording layer which is hardened by exposure with a laser to be higher than the film hardness of the entire body. Further, they found a plate production method for developing a planographic printing plate having such a recording layer using a developer having specific properties. These discoveries led to completion of the present invention.

Namely, the planographic printing plate of the present invention is a planographic printing plate comprising a substrate carrying thereon a recording layer which contains a polymerizable compound and an infrared absorbing agent, and causes a polymerization reaction by the action of light or heat to decrease solubility in an alkali developer, wherein the optical density of the recording layer is from 0.4 to 2.0, and the film hardness of the upper part of the recording layer after reduction in solubility in an alkali developer due to the action of light or heat is higher than the average film hardness of the recording layer.

In a preferable embodiment, the above-mentioned recording layer contains an infrared absorbing agent under conditions causing no ablation.

Further, in a certain embodiment, the method of producing a planographic printing plate of the present invention comprises exposing a planographic printing plate containing a substrate carrying thereon a recording layer which contains a polymerizable compound and an infrared absorbing agent, and causes a polymerization reaction by the action of light or heat to decrease solubility in an alkali developer, wherein the optical density of the recording layer is from 0.4 to 2.0, and the film hardness of the upper part of the recording layer after reduction in solubility in an alkali developer due to the action of light or heat is higher than the average film hardness of the recording layer, then, developing the plate by a developer showing lower permeability through the recording layer after hardening.

In the present invention, the expression "by the action of light or heat" also means "by both of the action of light and the action of heat".

Though the action of the present invention is not explicit, it is speculated that at the exposed surface of a recording layer whose solubility in an alkali developer decreases by exposure at or near the exposed surface, sensitivity to infrared laser is excellent, film hardness due to a polymerization reaction is high, and in the deeper portions of a recording layer, film hardness becomes lower because of diffusion of heat to a substrate. However, when such a photosensitive layer is developed after hardening (polymerization reaction), portions around the surface of a recording layer manifest lower permeability to an alkali developer and function as a protective layer. Consequently, development stability becomes excellent and an image having excellent discrimination is formed, and simultaneously, stability long-term is also obtained.

Further, it is believed that, in production of a planographic printing plate having such a recording layer, by selecting a developer capable of optimum permeation through a recording layer based on electrostatic capacity described later and by effecting development with such a developer, the developer does not easily permeate portion in the vicinity of a substrate which have relatively lower hardness and both effects of increase in sensitivity and prevention of decrease in printing endurance can be satisfactorily achieved.

DETAILED DESCRIPTION OF THE PREFERRED EMBODIMENTS

Figure 1:
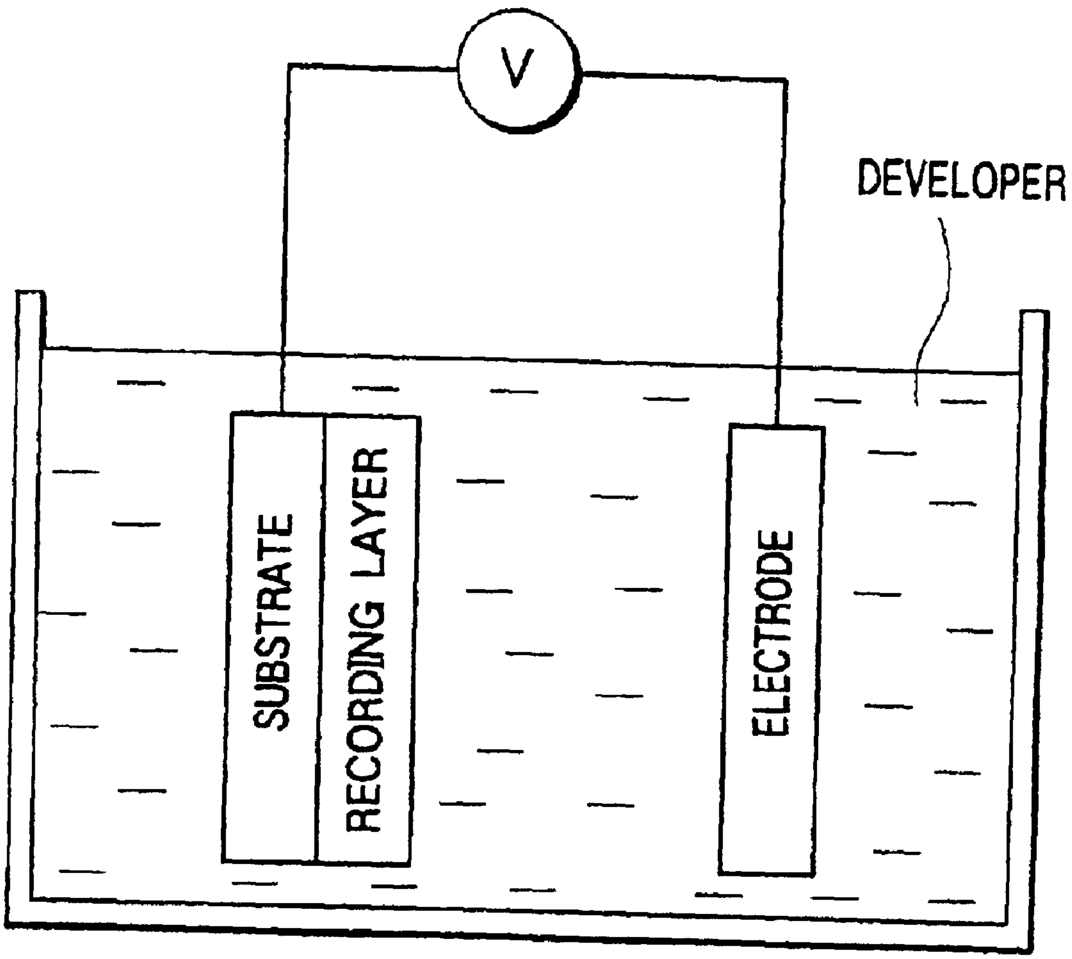
FIG. 1 is a schematic structual view showing one example of a method of measuring electrostatic capacity used for evaluation of permeability of a developer into a photosensitive layer.

The present invention will be described in detail below.

The planographic printing plate of the present invention comprises a recording layer having a polymerizable compound and an infrared absorbing agent, and in which a polymerization reaction is caused by the action of light or heat to thereby decrease solubility of the recording layer in an alkali developer, and in which, the optical density of the recording layer is from 0.4 to 2.0, and the film hardness of the upper portion of the recording layer after reduction in solubility in an alkali developer owing to hardening of the recording layer due to the action of light or heat is higher than the average film hardness of the recording layer.

In the planographic printing plate of the present invention, it is satisfactory that a recording layer as described above is provided on a substrate, and further, known layers such as a surface layer, intermediate layer, back coat layer and the like may also be provided as long as the effect of the present invention is not impaired.

Recording Layer

A recording layer of the planographic printing plate of the present invention is preferably formed on the exposure surface of the top layer of the planographic printing plate, and an infrared absorbing agent generates heat due to exposure to an infrared laser, a polymerization reaction occurs due to this heat, and only exposed portions of the recording layer are hardened to manifest lowering in solubility in an alkali developer.

An example of such typical recording layers is a photopolymerizable layer. The photopolymerizable layer contains (A) an infrared absorbing agent, (B) a radical generator and (C) a radical-polymerizable compound which causes a polymerization reaction with the generated radical and thereby causes hardening, and preferably, further contains (D) a binder polymer. The infrared absorbing agent converts absorbed infrared ray into heat, and a radical polymerization initiator such as an onium salt and the like is decomposed by heat generated in this conversion, to generate a radical. The radical-polymerizable compound is selected from compounds having at least one ethylenically unsaturated double bond, and at least one,and preferably two or more terminal ethylenically unsaturated bonds, and the generated radical causes chain polymerization reactions, and results in hardening.

The optical density of the recording layer of the present invention, specifically, the reflection density caused by an infrared absorbing agent in a recording layer for the exposed wavelength is from 0.4 to 2.0, and preferably from 0.6 to 1.6, and an infrared absorbed is so contained that the optical density is relatively high. Therefore, due to exposure using infra-red rays, a polymerization reaction is generated, and this reaction proceeds quickly in the vicinity of the surface of the recording layer, and thus high film hardness is archived. However, an infrared laser used for exposure does not easily permeate into the deeper portion of the recording layer, and further, heat is diffused to a substrate, and the film hardness around a substrate is lower in comparison. The film hardness of the upper portion of the recording layer is thus higher than the average film hardness of the recording layer. Here, the upper portion of the recording layer refers to a portion, within 20% of the thickness of the recording layer from the surface thereof.

For the difference between the film hardness of the upper portion of a recording layer after hardening and the average film hardness, the ratio of the film hardness of the upper portion of a recording layer to the average film hardness [value of (upper portion film hardness/average film hardness)] is preferably 1.2 or more, and further preferably from 20 to 1.3. When this difference is small and the above-mentioned value is too near 1, the discrimination of an image formed tends to decrease. Further, where the difference is extremely large there maybe, reduction in close adherence at the interface with a substrate. That is, neither of the above cases is desirable.

The film hardness can be measured by an ordinary method, and specifically, for example, an ultra micro extrusion hardness measuring apparatus formed by combining of a microscope equipped with a piezo-actuator, with a transducer is used, and an indenter having a triangle pyramidal tip is extruded into a recording layer, and displacement and load are measured to give a displacement curve, and the film hardness is read from this curve.

Here, the film hardness (H) is represented by $L_{max}/A$ wherein $L_{max}$ means the maximum load and A means the contact sectional area of an indenter in recording the maximum load. The contact sectional area A can be calculated from gradient $h_{plastic}$ of a tangential line drawn by linear approximation of the initial 30% of a gradual loading curve based on the aspect ratio of the indenter. The film hardnesses of the upper part of a recording layer and the whole layer are measured according to this method of measuring film hardness, by controlling the depth ($h_{total}$) to which the indenter is thrusted.

Specifically, a method described in X. Yun, R. Hsiao, D. B. Bogy, C. S. Bhatia, Computer Mechanics Laboratory, Technical Report No. 96-015, 1 (1996) can be applied, and in the present invention, Triboscope (trade name), a thrusting apparatus manufactured by HYSITRON is used as a measuring apparatus, and is installed on AFM (interatomic force microscope) SPA 300 (trade name, manufactured by Seiko Instruments K.K.), and the measured value is used.

Compounds used in a recording layer of a negative planographic printing plate will be described below.

(A) Infrared Absorbing Agent

A recording layer of the planographic printing plate of the present invention has a composion which can effect image recording by a laser which emits infrared rays. In such a recording layer, an infrared absorbing agent is preferably used. The infrared absorbing agent functions to convert absorbed infrared ray into heat. By heat generated in this reaction, a radical generator and an acid generator are decomposed to generate a radical and an acid. The infrared ray absorber used in the present invention is a dye or pigment showing an absorption maximum in the range from 760 nm to 1200 nm.

As the dye, commercially available dyes and, known materials described in literatures such as, for example, "Dye Manual" (edited by Yuki Gosei Kagaku Kyokai, 1960) and the like can be used. Specifically, examples include those described in paragraph numbers [0050] to [0051] of JP-A No. 10-39509.

Of these dyes, cyanine colorants, squarylium colorants, pyrylium salts, nickel thiolate complex are listed as particularly preferable examples. Further, cyanine colorants are preferable, and cyanine colorants of the following general formula (I) are most preferable.

General formula (I)

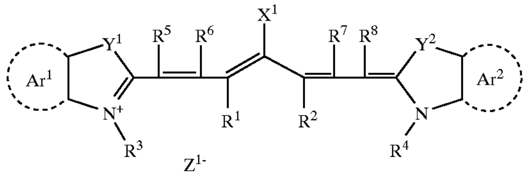

In the general formula (I), X1 represents a halogen atom or $X^2$—$L^1$ or $NL^2N^3$. Here, X2 represents an oxygen atom or sulfur atom, and $L^1$ represents a hydrocarbon group having 1 to 12 carbon atoms. Each of $L^2$ and $L^3$ independently represents a hydrocarbon group having 1 to 12 carbon atoms. Each of $R^1$ and $R^2$ independently represents a hydrocarbon group having 1 to 12 carbon atoms. From the standpoint of storage stability of a photosensitive layer application solution, $R^1$ and $R^2$ are preferably a hydrocarbon group having 2 or more carbon atoms, and further, it is particularly preferable that $R^1$ and $R^2$ are connected to each other to form a 5-membered or 6-membered ring.

$Ar^1$ and $Ar^2$ may be the same or different, and represent an aromatic hydrocarbon group which may have a substituent. $Y^1$ and $Y^2$ may be the same or different, and represent a dialkylmethylene group having 12 or less sulfur atoms or carbon atoms. $R^3$ and $R^4$ may be the same or different, and represent a hydrocarbon group having 20 or less carbon atoms and which may have a substituent. Examples of the preferable substituent are alkoxy groups having 12 or less carbon atoms, carboxyl groups and sulfo groups. $R^5$, $R^6$, $R^7$ and $R^8$ may be the same or different, and represent a hydrogen atom or a hydrocarbon group having 12 or less carbon atoms. From the standpoint of availability, they preferably represent a hydrogen atom. $Z^{1-}$ represents a counter anion. However, when any of $R^1$ to $R^8$ is substituted with a sulfo group, $Z^{1-}$ is not necessary. As $Z^{1-}$, preferable are halogen ions, perchlorate ion, tetrafluoroborate ion, hexafluorophosphate ion and sulfonate ion, and particularly preferable are a perchlorate ion, hexafluorophosphate ion and arylsulfonate ion, from the standpoint of storage stability of a photosensitive layer application solution.

As the specific examples of cyanine colorants of the general formula (I) which can be suitably used in the present invention, those described in Japanese Patent Application No. 11-310623, paragraph nos. [0017] to [0019] are listed.

As the pigment used in the present invention, commercially available pigments, and pigments described in Color Index (C. I.) manual, "Saishin Ganryo Binran (Current Pigment Manual)" (edited by Nippon Ganryo Gijutsu Kyokai, 1977), "Saishin Ganryo Oyo Gijutsu (Current Pigment Application Technology)" (published by CMC, 1986), "Insatsu Inki Gijutsu (Printing Ink Technology)" (published by CMC, 1984) can be utilized.

Examples of the pigments include black pigments, yellow pigments, orange pigments, brown pigments, red pigments, violet pigments, blue pigments, green pigments, fluorescent pigments, metal powder pigments, and additionally, polymer bond pigments. Details of these pigments are described in paragraph numbers [0052] to [0054] of JP-A No. 10-39509, and these can also be applied in the present invention. Of these pigments, preferable is carbon black.

It is preferable that the content of the above-mentioned dye or pigment in a recording layer is so selected that ablation does not occur in the recording layer and the optical density for wavelengths of infrared laser is from 0.4 to 2.0. Namely, when the amount of an infrared absorbing agent in a recording layer is too large, sudden increased heat generation occurs locally at portions exposed to infrared laser, and possibility of ablation of the whole recording layer increases. Further, the film hardness at deeper portion of a recording layer becomes too low and a possibility of reduction in printing endurance occurs. On the other hand, when the optical density is too low, the infrared laser used for writing reaches deeper portions of the recording layer, leading to a difficulty changing film hardness along the thickness direction of a recording layer.

From the standpoint of ablation only, even if the optical density of a recording layer is over 2.0, when the heat capacity of the whole recording layer is large, heat is diffused in the layer, and ablation does not occur. Therefore, the amount of an infrared absorbing agent should not necessarily be determined only by optical density. In determining the content of an infrared absorbing agent for improvement of sensitivity, it is preferable that the content thereof is appropriately determined in view of other components in the recording layer or the thickness of the layer while considering optical density.

(B) A Compound which Generates a Radical

As the compound generating a radical which is suitably used in the present invention, onium salts, and specifically, iodonium salts, diazonium salts and sulfonium salts are preferably used. Though these onium salts also function as an acid generator, when the onium salts are used together with a radical polymerizable compound described later, they function as an initiator for radical polymerization. The onium salts suitably used in the present invention are onium salts of the following general formulae (III) to (V).

$Ar^{11}—I^+—Ar^{12}\ Z^{11-}$ General formula (III)

$Ar^{21}—N^+{\equiv}N\ Z^{21-}$ General formula (IV)

General formula (V)

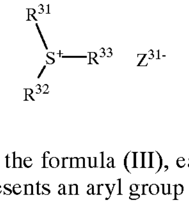

In the formula (III), each of $Ar^{11}$ and $Ar^{12}$ independently represents an aryl group having 20 or less carbon atoms and which may have having a substituent. When this aryl group has a substituent, preferable examples of the substituent include halogen atoms, nitro group, alkyl groups having 12 or less carbon atoms, alkoxy groups having 12 or less carbon atoms, or aryloxy groups having 12 or less carbon atoms. $Z^{11-}$ represents a counter ion selected from the group consisting of halogen ions, perchlorate ion, carboxylate ion, tetrafluoroborate ion, hexafluorophosphate ion, and sulfonate ion, and preferable are a perchlorate ion, hexafluorophosphate ion and arylsulfonate ion.

In the formula (IV), $Ar^{21}$ represents an aryl group having 20 or less carbon atoms and which may have a substituent. Examples of the preferable substituent include halogen atoms, nitro group, alkyl groups having 12 or less carbon atoms, alkoxy groups having 12 or less carbon atoms, aryloxy groups having 12 or less carbon atoms, alkylamino groups having 12 or less carbon atoms, dialkylamino groups having 12 or less carbon atoms, arylamino groups having 12 or less carbon atoms and diarylamino groups having 12 or less carbon atoms. $Z^{21-}$ represents a counter ion as defined for $Z^{11-}$.

In the general formula (V), $R^{31}$, $R^{32}$ and $R^{33}$ may be the same or different, and represent a hydrocarbon group having 20 or less carbon atoms and which may have a substituent. Examples of preferable substituents include halogen atoms, nitro group, alkyl groups having 12 or less carbon atoms, aryloxy groups having 12 or less carbon atoms. $Z^{31-}$ represents a counter ion as defined for $Z^{11-}$.

Specific examples of onium salts which can be suitably used in the present invention, include those described in Japanese Patent Application No. 11-310623, paragraph nos. [0030] to [0033], and Japanese Patent Application No. 2000-160323, paragraph nos. [0015] to [0046], filed previously by the present applicant.

The onium salt used in the present invention has a maximum absorption wavelength preferably of 400 nm or less, and further preferably of 360 nm or less. By thus controlling the absorption wavelength within the ultraviolet region, a planographic printing plate can be handled under white light.

These onium salts can be added into a photosensitive layer application solution in a proportion of from 0.1 to 50% by weight, preferably from 0.5 to 30% by weight, and particularly preferably from 1 to 20% by weight based on the total weight of all solid components in the photosensitive layer application solution. When the addition amount is less than 0.1% by weight, sensitivity lowers, and when over 50% by weight, staining occurs on non-image portions in printing. These onium salts may be used alone or in combination of two or more. Further, these onium salts may be added, together with other components, to the same layer, or another layer may be provided to which the onium salts are added.

(C) Radical Polymerizable Compound

The radical polymerizable compound used in a recording layer in the present invention is a radical polymerizable compound having at least one ethylenically unsaturated double bond, and is selected from compounds having at least one, and preferably two or more terminal ethylenically unsaturated bonds. Such a compound group is widely known in the art, and in the present invention, these compounds can be used without specific restriction. They have a chemical form, such as, for example, a monomer, prepolymer, namely, dimer, trimer and oligomer, or a mixture thereof and a copolymer thereof, or the like. Examples of a monomer and copolymer thereof, include unsaturated carboxylic acids (e.g., acrylic acid, methacrylic acid, itaconic acid, crotonic acid, isocrotonic acid, maleic acid and the like) , esters thereof, and amides, and preferably, esters of an unsaturated carboxylic acid with an aliphatic polyhydric alcohol compound, or amides of an unsaturated carboxylic acid with an aliphatic polyvalent amine compound, are used. Further, unsaturated carboxylates having a nucleophilic substituent such as a hydroxyl group, amino group, mercapto group and the like, adducts of amides with monofunctional or polyfunctional isocyanates, or epoxys, dehydration condensation reaction products with a monofunctional or polyfunctional carboxylic acid, and the like are suitably used. Further, adducts of an unsaturated carboxylate having an electrophilic substituent such as an isocyanate group, epoxy group and the like, or amides with monofunctional or polyfunctional alcohols, amines and thiols, and, substitution reaction products of an unsaturated carboxylate having a releasable substituent such as a halogen group, tosyloxy group and the like, or amides with monofunctional or polyfunctional alcohols, amines and thiols, are also suitable. As other examples, compounds obtained by substituting the above-mentioned unsaturated carboxylic acid by an unsaturated phosphonic acid, styrene and the like can also be used.

Specific examples of acrylates, methacrylates, itaconates, crotonates, isocrotonates and maleates which are a radical polymerizable compound which is an ester of a aliphatic polyhydric alcohol compound with an unsaturated carboxylic acid are described in Japanese Patent Application No. 11-310623, paragraph nos. [0037] to [0042], and these compounds can also be applied to the present invention.

As examples of other esters, for example, aliphatic alcohol-based esters described in JP-B Nos. 46-27926, 51-47334 and 57-196231, esters having an aromatic skeleton described in JP-A Nos. 59-5240, 59-5241 and 2-226149, esters having an amino group described in JP-A No. 1-165613, and the like can also be suitably used.

As specific examples of a monomer of an amide of an aliphatic polyvalent amine compound with an unsaturated carboxylic acid, there are methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, xylylenebismethacrylamide and the like.

Examples of other preferable amide-based monomers include monomers having a cyclohexylene structure described in JP-B No. 54-21726.

Further, urethane-based addition polymerizable compounds produced by using an addition reaction of an isocyanate with a hydroxyl group are also suitable, and as specific examples thereof include vinylurethane compounds containing two or more polymerizable vinyl groups in one molecule obtained by adding a vinyl monomer having a hydroxyl group of the following general formula (VI) to a polyisocyanate compound having two or more isocyanate groups in one molecule described in JP-B No. 48-41708, and the like.

$$CH_2{=}C(R^{41})COOCH_2CH(R^{42})OH \qquad \text{General formula (VI)}$$

(wherein, $R^{41}$ and $R^{42}$ represent H or $CH_3$)

Also, urethane acrylates as described in JP-A No. 51-37193, JP-B Nos. 2-32293 and 2-16765, and urethane compounds having an ethylene oxide-based skeleton described in JP-B Nos. 58-49860, 56-17654, 62-39417 and 62-39418 are suitable.

Further, radical polymerizable compounds having an amino structure or sulfide structure in the molecule described in JP-A Nos. 63-277653, 63-260909 and 1-105238 may also be used.

Other examples include polyfunctional acrylates and methacrylates, such as polyester acrylates as described in JP-A Nos. 48-64183 and 49-43191 and JP-B No. 52-30490, epoxy acrylates obtained by reacting an epoxy resin with a (meth)acrylic acid, and the like. Furthermore, specific unsaturated compounds described in JP-B Nos. 46-43946, 1-40337 and 1-40336, and vinylphosphonic acid-based compounds described in JP-A No. 2-25493, and the like can also be used. In some cases, structures containing a perfluoroalkyl group described in JP-A No. 61-22048 are suitably used. Further, those introduced as photosetting monomers and oligomers in Nippon Secchaku Kyokai Shi (Japanese Adhesion Institution Journal) vol. 20, No. 7, pp. 300 to 308 (1984) can also be used.

Details of the method of using these radical polymerizable compounds such as the kind of a structure used, whether it is used singly or combined, the addition amount, and the like, can be optionally set according to the desired function of the final recording material. Regarding sensitivity, a structure having high content of unsaturated groups per molecule is preferable. In many cases, two or more functional structure is preferable. For enhancing the strength of an image portion, namely, a hardened film, a structure having three or more function groupes is preferably used. Using combination of compounds having different numbers of functional groups and different polymerizable groups (e.g., acrylate-based compound, methacrylate-based compound, styrene-based compound and the like) is also preferably used for controlling both of photosensitivity and strength.

The preferable compounding ratio of a radical polymerizable compound is, in may cases, from 5 to 80% by weight, and preferably from 20 to 75% by weight based on the total weight of all components in the composition. These may be used alone or in combination of two or more. In addition, regarding the use method of a radical polymerizable compound, a suitable structure, compounding ratio and addition amount can be optionally selected from the standpoints of the extent of polymerization inhibition on oxygen, resolution, fogging property, variation in refractive index, surface stickiness, and the like, and further, in some cases, layer structures and application methods such as priming and finishing can also be effected.

(D) Binder Polymer

In the present invention, a binder polymer is also used. As the binder, a linear organic polymer is preferably used. As such "linear organic polymer", any polymer may be used. Preferably, for enabling development with water or development with weak alkaline water, linear organic polymers which are soluble in or swellable with water or weak alkaline water are selected. The linear organic polymer is selected for use, based not only on use as a film forming agent for forming a photosensitive layer, but based also on use with water, weak alkaline water or organic solvent developer. For example, when a water-soluble organic polymer is used, developing with water becomes possible. As such a linear organic polymer, there are radical polymers having a carboxyl group as the side chain, for example, those described in JP-A No. 59-44615, JP-B Nos. 54-34327, 58-12577 and 54-25957, JP-A No. 54-92723, 59-53836 and 59-71048, namely, methacrylic acid copolymers, acrylic acid copolymers, itaconic acid copolymers, crotonic acid copolymers, maleic acid copolymers, partially esterified maleic acid copolymer, and the like. Further, there are acidic cellulose derivatives having a carboxyl group as the side chain likewise. In addition, those obtained by adding a cyclic acid anhydride to a polymer having a hydroxyl group, and the like, are useful.

Particularly, among those compounds, (meth)acrylic resins having a benzyl group or allyl group, and a carboxyl group as the side chains are suitable since they are excellent in attaining balance between film strength, sensitivity and developing property.

Further, as the binder polymer, "water-insoluble and alkali water-soluble polymers" described below (hereinafter, appropriately referred to simply as alkali water-soluble polymer) can also be used.

The alkali water-soluble polymer is a water-insoluble and alkali water-soluble polymer and has excellent film forming property, therefore, can form a layer.

The alkali water-soluble polymer in the present invention includes homo-polymers containing an acidic group on the main chain and/or side chain in a polymer and copolymers thereof or mixtures thereof. Therefore, a polymer layer in the present invention has such a property that, when contacted with an alkaline developer, it is dissolved in the developer.

Among them, those having an acidic group exemplified in the following (1) to (6) on the main chain and/or side chain of the polymer are preferable from the standpoint of solubility in an alkaline developing solution.

(1) Phenol group (—Ar—OH)
(2) Sulfonamide group ($—SO_2NH—R$)
(3) Substituted sulfonamide-based acid group (hereinafter, referred to as "active imide group") [$—SO_2NHCOR$, $—SO_2NHSO_2R$, $—CONHSO_2R$]
(4) Carboxyl group ($—CO_2H$)
(5) Sulfonic group ($—SO_3H$)
(6) Phosphoric group ($—OPO_3H_2$)

Among alkaline water-soluble polymers having an acidic group selected from the above-mentioned (1) to (6), alkaline water-soluble polymers having (1) a phenol group, (2) a sulfonamide group and (3) an active imide group are most preferable from the standpoints of solubility in an alkaline developing solution, developing latitude, and sufficient ensuring of film strength.

Examples of the alkaline water-soluble polymers having an acidic group selected from the above-mentioned (1) to (6) include the following polymers.

As the alkaline water-soluble polymer (1) having a phenol group include novolak resins and polymers having a hydroxyaryl group as the side chain. Examples of the novolak resin include resins obtained by condensing phenols with aldehydes under acidic condition.

Among them, preferable are, for example, novolak resins obtained from phenol and formaldehyde, novolak resins obtained from m-cresol and formaldehyde, novolak resins obtained from p-cresol and formaldehyde, novolak resins obtained from o-cresol and formaldehyde, novolak resins obtained from octylphenol and formaldehyde, novolak resins obtained from m-/p-mixed cresol and formaldehyde, novolak resins obtained from a phenol/cresol (may be m-, p-, o- or m-/p-, m-/o-, o-/p-mixed type) mixture and formaldehyde, and the like.

The novolak resin is preferably selected from those having a weight-average molecular weight from 800 to 200000 and a number-average molecular weight from 400 to 60000.

Further, the above-mentioned polymers having a hydroxyaryl group as the side chain are also preferable, and examples of the hydroxyaryl group in this polymer include an aryl group to which one or more OH groups are bonded.

Examples of the above-mentioned aryl group include, for example, a phenyl group, naphthyl group, anthracenyl group, phenanthrenyl group and the like, and of them, a phenyl group or naphthyl group is preferable from the standpoints of easy availability and physical properties.

Therefore, as the hydroxyaryl group, a hydroxyphenyl group, dihydroxyphenyl group, trihydroxyphenyl group, tetrahydroxyphenyl group, hydroxynaphthyl group, dihydroxynaphthyl group and the like are preferable.

These hydroxyaryl groups may further have a substituent such as a halogen atom, a hydrocarbon group having 20 or less carbon atom, an alkoxy group having 20 or less carbon atom, an aryloxy group having 20 or less carbon atoms or the like.

The hydroxyaryl group is bonded as the side chain in the form of a pendant to the main chain constituting a polymer, and may also have a connecting group between the main chain.

Examples of the polymer having a hydroxyaryl group as the side chain which can be used in this embodiment include, for example, polymers having any one of constituent units of the following general formulae (IX) to (XII). However, the scope of the present invention is not limited to these examples.

(IX)

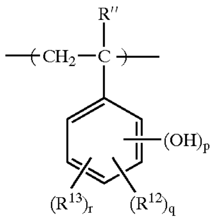

(X)

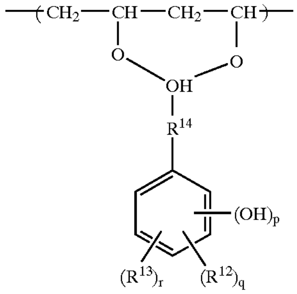

(XI)

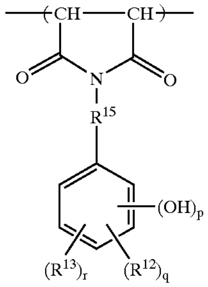

(XII)

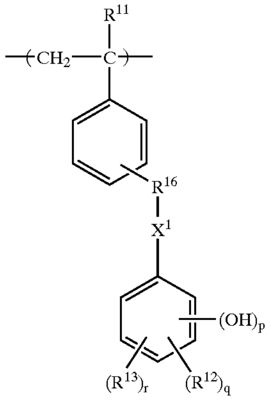

In the general formulae (IX) to (XII), $R^{11}$ represents a hydrogen atom or methyl group. $R^{12}$ and $R^{13}$ may be the same or different, and represent a hydrogen atom, a halogen atom, a hydrocarbon group having 10 or less carbon atoms, an alkoxy group having 10 or less carbon atoms or an aryloxy group having 10 or less carbon atoms. $R^{12}$ and $R^{13}$ may be bonded or ring-condensed to form a benzene ring or cyclohexane ring. $R^{14}$ represents a single bond or a divalent hydrocarbon group having 20 or less carbon atom. $R^{15}$ represents a single bond or a divalent hydrocarbon group having 20 or less carbon atom. $R^{16}$ represents a single bond or a divalent hydrocarbon group having 10 or less carbon atom. X1 represents a single bond, ether bond, thioether bond, ester bond or amide bond. p represents an integer from 1 to 4. Each of q and r independently represents an integer from 0 to 3.

Specific examples of constituent units of the above-mentioned general formulae (IX) to (XII) include, but are not limited to, in the present invention, the following compounds.

(IX-1)

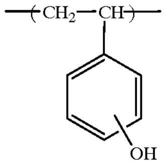

(o-, m-, p-)

(IX-2)

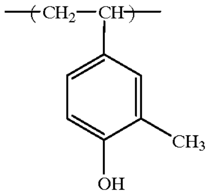

(IX-3)

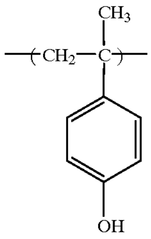

(IX-4)

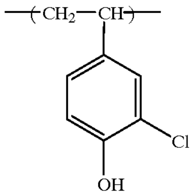

(X-1)

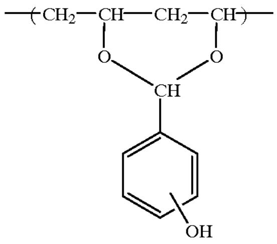

(o-, m-, p-)

-continued
(X-2)
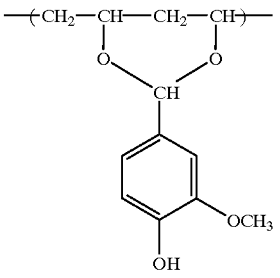
(X-3)
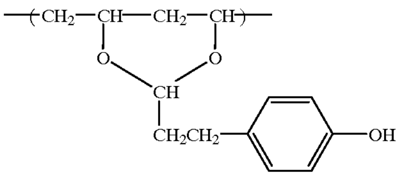
(X-4)
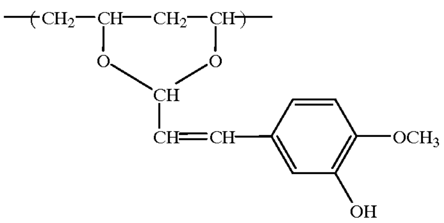
(X-5)
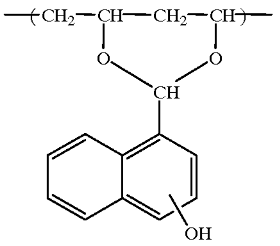
(XI-1)
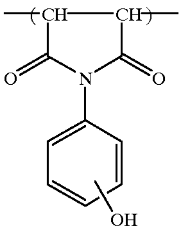
(o-, m-, p-)
(XI-2)
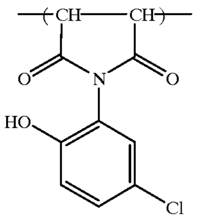
-continued
(XI-3)
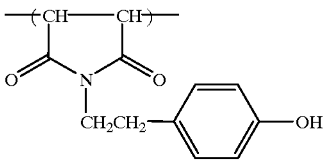
(XI-4)
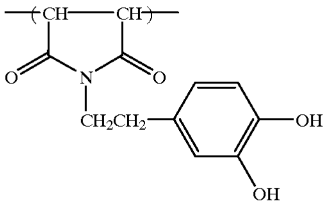
(XI-5)
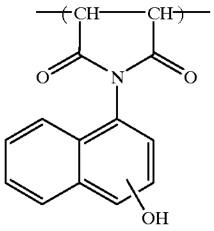
(XII-1)
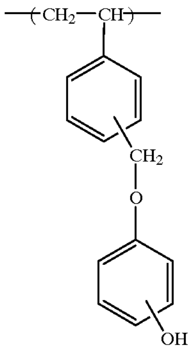
(XII-2)
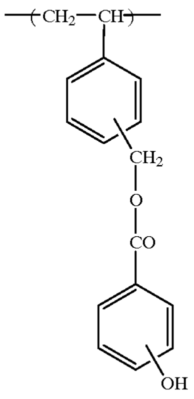

-continued (XII-3)

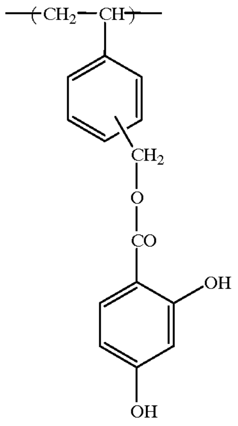

(XII-4)

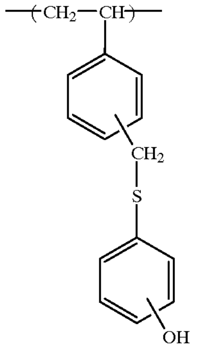

(XII-5)

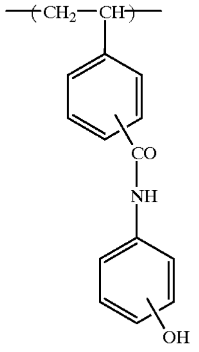

(XII-6)

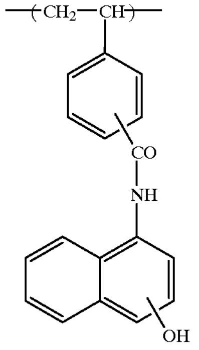

Polymers containing the above-mentioned constituent units can be synthesized by a method appropriately selected from conventionally known methods.

A polymer having a constituent unit of the general formula (IX) can be obtained, for example, by radical-polymerizing or anion-polymerizing of a corresponding styrene derivative in which a hydroxyl group is protected as an acetate or t-butyl ether to obtain a polymer, then, de-protecting the polymer.

A polymer having a constituent unit of the general formula (X) can be synthesized, for example, by methods described in JP-A Nos. 64-32256 and 64-35436.

A polymer having a constituent unit of the general formula (XI) can be obtained, for example, by reacting an amine compound having a hydroxyl group with maleic anhydride to obtain a corresponding monomer, then, radical-polymerizing the monomer to obtain a polymer.

A polymer having a constituent unit of the general formula (XII) can be obtained, for example, by deriving styrenes having a functional group useful for synthesis such as chloromethylstyrene, carboxystyrene and the like as raw materials into a monomer corresponding to the general formula (XII), and by further radical-polymerizing the monomer to form a polymer.

In these embodiments, homopolymers composed only of a constituent unit of the general formula (IX) to (XII) may be used, and also, copolymers containing other constituent units may be used.

Examples of the other constituent units include constituent units derived from known monomers such as acrylates, methacrylates, acrylamides, methacrylamides, vinyl esters, styrene, acrylic acid, methacrylic acid, acrylonitrile, maleic anhydride, maleic imide and the like.

Examples of the above-mentioned acrylates include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, glycidyl acrylate, benzyl acrylate, methoxybenzyl acrylate, chlorobenzyl acrylate, 2-(p-hydroxyphenyl) ethyl acrylate, furfuryl acrylate, tetrahydrofurfuryl acrylate, phenyl acrylate, chlorophenyl acrylate, sulfamoylphenyl acrylate and the like.

Examples of the above-mentioned methacrylates include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, methoxybenzyl methacrylate, chlorobenzyl methacrylate, 2-(p-hydroxyphenyl)ethyl methacrylate, furfuryl methacrylate, tetrahydrofurfuryl methacrylate, phenyl methacrylate, chlorophenyl methacrylate, sulfamoylphenyl methacrylate and the like are listed.

Examples of the above-mentioned acrylamide, include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(p-hydroxyphenyl)acrylamide, N-(sulfamoylphenyl) acrylamide, N-(phenylsulfonyflacrylamide, N-(tolylsulfonyl)acrylamide, N,N-dimethylacrylamide, N-methyl-N-phenylacrylamide, N-hydroxyethyl-N-methylacrylamide arid the like.

Examples of the above-mentioned methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(p-hydroxyphenyl) methacrylamide, N-(sulfamoylphenyl)methacrylamide, N-(phenylsulfonyl)methacrylamide, N-(tolylsulfonyl) methacrylamide, N,N-dimethylmethacrylamide, N-methyl-N-phenylmethacrylamide, N-hydroxyethyl-N-methylmethacrylamide and the like.

Examples of the above-mentioned vinylesters include vinyl acetate, vinyl butyrate, vinyl benzoate and the like.

Examples of the above-mentioned styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene and the like.

Of these monomers, acrylates, methacrylates, acrylamides, methacrylamides, vinyl esters, styrene, acrylic acid, methacrylic acid, acrylonitrile having 20 or less carbon atoms are preferable.

The proportion of constituent units of the general formulae (IX) to (XII) contained in a copolymer using the above-mentioned monomers is preferably from 5 to 100% by weight, more preferably from 10 to 100% by weight.

The molecular weight of the polymer having a hydroxyaryl group as the side chain is preferably 4000 or more, more preferably from 10000 to 300000 in terms of weight-average molecular weight. The number-average molecular weight is preferably 1000 or more, more preferably from 2000 to 250000. Further, degree of polydispersion (weight-average molecular weight/number-average molecular weight) is preferably or more, more preferably from 1.1 to 10.

The polymer having a hydroxyaryl group as the side chain may be any of a random polymer, block polymer, graft polymer and the like, and among them, a random polymer is preferable.

As the alkaline water-soluble polymer (2) having a sulfonamide group, for example, polymers constituted, as the main constituent component, of a minimum constituent unit derived from a compound having a sulfonamide group are listed. As the above-mentioned compound, compounds having, in the molecule, one or more sulfonamide groups in which at least one hydrogen atom is bonded to a nitrogen atom and one or more polymerizable unsaturated bonds, are listed. Among other, lower molecular weight compounds having in the molecule an acryloyl group, allyl group or vinyloxy group, and a substituted or mono-substituted aminosulfonyl group or a substituted sulfonylimino group are preferable, and for example, compounds of the following general formulae 1 to 5 are listed.

general formula 1

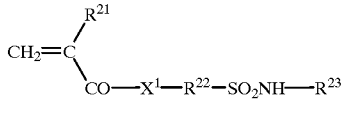

general formula 2

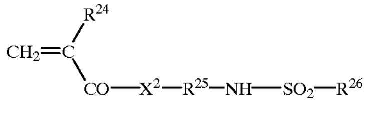

-continued general formula 3

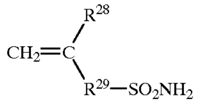

general formula 4

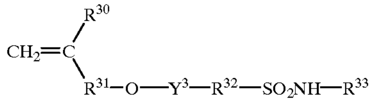

general formula 5

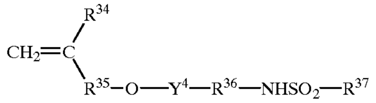

[wherein, each of $X^1$ and $X^2$ independently represents —O— or —$NR^{27}$—. Each of $R^{21}$ and $R^{24}$ independently represents a hydrogen atom or —$CH_3$. Each of $R^{22}$, $R^{25}$, $R^{29}$, $R^{32}$ and $R^{36}$ independently represents an alkylene group having 1 to 12 carbon atoms optionally having a substituent, a cycloalkylene group, an arylene group or an aralkylene group. Each of $R^{23}$, $R^{27}$ and $R^{33}$ independently represents a hydrogen atom, an alkyl group having 1 to 12 carbon atoms and which may have a substituent, a cycloalkyl group, an aryl group or an aralkyl group. Further, each of $R^{26}$ and $R^{37}$ independently represents an alkyl group having 1 to 12 carbon atoms and which may have a substituent, a cycloalkyl group, an aryl group or an aralkyl group. Each of $R^{28}$, $R^{30}$ and $R^{34}$ independently represents a hydrogen atom of —$CH_3$. Each of $R^{31}$ and $R^{35}$ independently represents a single bond, or an alkyl group having 1 to 12 carbon atoms and which may have a substituent, a cycloalkylene group, an arylene group or an aralkylene group. Each of $Y^3$ and $Y^4$ independently represents a single bond, or —CO—.].

Among compounds of the general formulae 1 to 5, m-aminosulfonylphenyl methacrylate, N-(p-aminosulfonylphenyl)methacrylamide, N-(p-aminosulfonylphenyl)acrylamide and the like can be suitably used, in the negative planographic printing material of the present invention.

Examples of the alkaline water-soluble polymer (3) having an active imide group include polymers formed of a minimum constituent unit derived from a compound having an active imide group as the main constituent component. Examples of the above-mentioned compound are compounds having, in the molecule, one or more active imide groups of the following structural formula and one or more polymerizable unsaturated bonds.

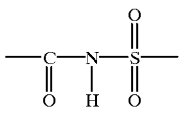

Specifically, N-(p-toluenesulfonyl)methacrylamide, N-(p-toluenesulfonyl)acrylamide and the like can be suitably used.

Examples of the alkaline water-soluble polymer (4) having a carboxyl group include polymers formed of a minimum constituent unit derived from a compound having, in the molecule, one or more carboxyl groups and one or more polymerizable unsaturated groups as the main constituent component.

Example of the alkaline water-soluble polymer (5) having a sulfonic group, for example, polymers formed of a minimum constituent unit derived from a compound having, in the molecule, one or more sulfonic groups and one or more polymerizable unsaturated groups, as the main constituent component.

As the alkaline water-soluble polymer (6) having a phosphate group, for example, polymers constituted, as the main constituent component, of a minimum constituent unit derived from a compound having, in the molecule, one or more phosphate groups and one or more polymerizable unsaturated groups are listed.

These alkali water-soluble polymers preferably further have a radical polymerizable ethylenic double bond on the main chain or side chain thereof. It is preferable that an ethylene group, acryloyloxy group, methacryloyloxy group and vinyl group are contained as the ethylenic double bond.

The minimum constituent unit having an acidic group selected from the above-mentioned (1) to (6) forming an alkaline water-soluble polymer used in a material for the negative planographic printing plate of the present invention is not necessarily restricted to one kind specifically, and those obtained by copolymerizing two or more minimum constituent units having the same acidic group or two or more minimum constituent units having different acidic groups can also be used.

As the method of copolymerization, a graft copolymerization method, block copolymerization method, random copolymerization method and the like which are conventionally known can be used.

In the above-mentioned polymers, compounds having an acidic group selected from (1) to (6) to be copolymerized are contained in the copolymer in an amount of preferably 10 mol % or more, more preferably 20 mol % or more. When less than 10 mol %, there is a tendency that developing latitude can not be sufficiently improved.

In the present invention, when compounds are copolymerized to form a copolymer, other compounds not containing the above-mentioned acidic groups (1) to (6) can also be used as the compounds. Examples of the other compounds not containing the above-mentioned acidic groups (1) to (6) are compounds as listed in the following (m1) to (m11).

(m1): For example, acrylates and methacrylates having an aliphatic hydroxyl group such as 2-hydroxyethyl acrylate or 2-hydroxyethyl methacrylate and the like.

(m2): Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, N-dimethylamylethyl acrylate and the like.

(m3): Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylamylethyl methacrylate and the like.

(m4): Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide and the like.

(m5): Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like.

(m6): Vinyl esters such as vinyl acetate, vinylchloro acetate, vinyl butyrate, vinyl benzoate and the like.

(m7): Styrenes such as styrene, α-methylstyrene, methylstyrene, chloromethylstyrene and the like.

(m8): Vinyl ketones such as methyl vinyl ketone, ethyl vinyl ketone, propyl vinyl ketone, phenyl vinyl ketone and the like.

(m9): Olefins such as ethylene, propylene, isobutylene, butadiene, isoprene and the like.

(m10): N-vinylpyrrolidone, N-vinylcarbazole, 4-vinylpyridine, acrylonitrile, methacrylonitrile and the like.

(m11): Unsaturated imides such as maleimide, N-acryloylacrylamide, N-acetylmethacrylamide, N-propionylmethacrylamide, N-(p-chlorobenzoyl) methacrylamide and the like.

As the alkali water-soluble polymer used in the planographic printing plate of the present invention, those having a weight-average molecular weight of 2000 or more and a number-average molecular weight of 500 or more are preferable from the standpoints of sensitivity and development latitude, irrespective of whether they are homopolymers or copolymers, and further preferable are those having a weight-average molecular weight of from 5000 to 300000 and a number-average molecular weight of from 800 to 250000. Further, those having a degree of polydispersion (weight-average molecular weight/number-average molecular weight) of 1.1 to 10 are preferable.

When a copolymer is used in the present invention, the compounding weight ratio of a minimum constituent unit derived from a compound having an acidic group selected from the above-mentioned (1) to (6) which form the main chain and/or side chain thereof to a minimum constituent unit containing no acidic group of the (1) to (6) which form part of the main chain and/or side chain is preferably from 50:50 to 5:95, more preferably from 40:60 to 10:90 from the standpoint of effect.

The above-mentioned alkali water-soluble polymers may be used each alone or in combination of two or more.

Further, urethane-based binder polymers containing an acidic group described in JP-B Nos. 7-12004, 7-120041, 7-120042, 8-12424, JP-A Nos. 63-287944, 63-287947, 1-271741, 10-116232 and the like are very excellent in strength, and consequently, advantageous from the standpoints of printing endurance and low exposure suitability.

Further, in addition to the above-mentioned polymers, polyvinylpyrrolidone and polyethylene oxide and the like are useful as the water-soluble linear organic polymer. For enhancing the strength of a hardened film, alcohol-soluble nylon, polyether of 2-bis-(4-hydroxyphenyl)-propane and epichlorohydrin, and the like are also useful.

The weight-average molecular weight of a polymer used in the present invention is preferably 5000 or more, further preferably from 10000 to 300000, and the number-average molecular weight is preferably 1000 or more, further preferably from 2000 to 250000. The degree of polydispersion (weight-average molecular weight/number-average molecular weight) is preferably 1 or more, further preferably from 1.1 to 10.

These polymers maybe any of a random polymer, block polymer, graft polymer and the like, and, a random polymer is preferable.

The binder polymer used in the present invention may be used alone or in admixture. These polymers are added into a recording layer in a proportion of 20 to 95% by weight, and preferably 30 to 90% by weight based on the total amount of all solid components in a recording layer application solution. In the case of an addition amount of less than 20% by weight, when an image is formed, the strength of image portion is impaired. In the case of an addition amount of over 95% by weight, an image is not formed. The weight ratio of a radical polymerizable compound having an ethylenically unsaturated double bond to a linear organic polymer is preferably from 1/9 to 7/3.

As the materials which form the recording layer of the present invention, various additives can be used together, if necessary, in addition to the above-mentioned compounds.

For example, thermally decomposable compounds such as onium salts, aromatic sulfonates and the like described as "other components" which can be added to a positive photosensitive composition in paragraph number [0067] and those following in JP-A No. 11-174681 are suitable for controlling an ability to inhibit dissolving of image portion, and additionally, additives useful for improving sensitivity such as cyclic acid anhydrides, phenols, organic acids and the like, surfactants, printing agents, dyes as an image coloring agent, pigments and the like described as "other components" in the same publication can also be used likewise in the present invention.

Further, epoxy compounds, vinyl ether compounds, further, phenol compounds having a hydroxymethyl group described in JP-A No. 8-276558, crosslinkable compounds having an alkali dissolving suppressing action described in JP-A No. 11-160860, and the like can also be added appropriately according to the object.

Other Components

Various compounds may also be added to a recording layer in the present invention, if necessary, in addition to the above-mentioned compound. For example, dyes manifesting large absorption in a visible light region can be used as an image-coloring agent. Further, pigments such as phthalocyanine-based pigments, azo-based pigments, carbon black, titanium oxide and the like can also be suitably used.

It is preferable to add these coloring agents to facilitate discrimination between image portions and non-image portions after formation of images. The addition amount thereof is from 0.01 to 10% by weight based on the total amount of all solid components in a recording layer application solution.

Further, in the present invention, when the recording layer is a photopolymerizable layer, it is desirable to add a small amount of a heat polymerization inhibitor for inhibiting unnecessary heat polymerization of a radical polymerizable compound having an ethylenically unsaturated double bond during preparation or storage of an application solution. As the suitable heat polymerization inhibiting agent, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitroso-N-phenylhydroxylamine aluminum salt and the like are listed. The amount of a heat polymerization inhibiting agent added is preferably from about 0.01% by weight to about 5% by weight based on the weight of the whole composition. If necessary, higher fatty acid derivatives such as behenic acid and behenic amide may be added to prevent polymerization inhibition by oxygen, or it may be allowed to locally exist on the surface of a recording layer in a process of drying after application. The addition amount of a higher fatty acid derivative is preferably from about 0.1% by weight to about 10% by weight based on the whole composition.

Further, in a recording layer application solution in the present invention, nonionic surfactants as described in JP-A No. 62-251740 and 3-208514, and ampholytic surfactants as described in JP-A Nos. 59-121044 and 4-13149 can be added, for increasing stability of treatment with respect to development conditions.

Moreover, in a recording layer application solution in the present invention, a plasticizer is added, if necessary, for imparting flexibility of a film and the like. For example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and the like are used.

For producing the planographic printing plate of the present invention, it may be usually advantageous that the above-mentioned components necessary for a recording layer application solution are dissolved in a solvent to prepare a solution which is applied on a suitable substrate. Examples of the solvent herein used include, but not limited to, ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, methyl isobutyl ketone, hydrogen and the like. These solvents are used alone or in admixture. The concentration of the above-mentioned components (all solid components including additives) in a solvent is preferably from 1 to 50% by weight.

Regarding the amount of this recording layer applied, the application amount of a polymer layer (solid component) on a substrate obtained after application and drying varies depending on use, Lut is preferably from 0.1 to 5.0 $g/m^2$ in general, in the case of use as a planographic printing plate, though it varies depending on use.

As the application method, various methods can be used, and for example include bar coater application, rotation application, spray application, curtain application, dip application, air knife application, blade application, roll application and the like.

Substrate

The substrate is a dimensionally stable plate, and there are listed, for example, paper, paper laminated with plastics (for example, polyethylene, polypropylene, polystyrene and the like), metal plates (for example, aluminum, zinc, copper and the like), and plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and the like), paper or plastic films laminated or vapor-deposited with metals as described above, and the like.

As the substrate used in the present invention, polyester films or aluminum plates are preferable, and of them, an aluminum plate which has excellent dimension stability and is relatively cheap is particularly preferable. The suitable aluminum plate is a pure aluminum plate or an alloy which is plate composed mainly of aluminum and contains a trace amount of foreign elements, and further, plastic films laminated or deposited with aluminum may also be used. As the foreign elements contained in an aluminum alloy, silicon, iron, manganese, copper, magnesium, chromium, zinc, bismuth, nickel, titanium and the like are listed. The content of the foreign elements in the alloy is at most 10% by weight or less. In the present invention, particularly suitable aluminum is pure aluminum, however, since completely pure aluminum is not produced easily from the standpoint of refining technology, those containing a trace amount of foreign elements may also be used. The aluminum plate thus applied to the present invention does not have a formulation limited within a specific range, and aluminum plates made of conventionally known and used materials can be appropriately utilized.

The thickness of the above-mentioned aluminum plate is from about 0.1 to 0.6 mm, preferably from 0.15 to 0.4 mm, particularly preferably from 0.2 to 0.3 mm.

An aluminum plate is roughened before used, and prior to roughening, if required, de-greasing treatment is conducted using a surfactant, organic solvent or alkaline aqueous solution and the like, for example, for removing a drawing oil on the surface.

The surface roughening treatment of the surface of an aluminum plate is conducted by various methods, and for example, a mechanical roughening method, a method of solving and roughening the surface electrochemically, and a method of selectively solving the surface, are used. As the mechanical method, known methods such as a ball polishing method, brush polishing method, buff polishing method and the like can be used. As the electrochemical roughening method, methods using alternating current or direct current in a hydrochloric acid or nitric acid electrolyte solution are used. Further methods using both hydrochloric acid and nitric acid electrolyte solutions in combination can also be used as disclosed in JP-A No. 54-63902.

An aluminum plated thus roughened can be subjected, if necessary, to alkali etching treatment and neutralization treatment, then, for enhancing water-retention and abrasion-resistance of the surface, to anodizing treatment, if desired. As the electrolytes used for anodizing treatment of an aluminum plate, various electrolytes forming a porous oxide film can be used, and in general, sulfuric acid, phosphoric acid, oxalic acid, chromic acid or a mixed acid thereof can be used. The concentrations of these electrolytes are appropriately determined depending on the kinds of the electrolytes.

The treating conditions for anodizing can not universally be specified since they change variously depending on electrolytes used, and in general, it is suitable that the concentration of electrolytes is from 1 to 80% by weight based on the solution, the liquid temperature is from 5 to 70° C., the current density is from 5 to 60 A/dm$^2$, the voltage is from 1 to 100 V, and the electrolysis time is from 10 seconds to 5 minutes. If the amount of an anodized film is less than 1.0 g/m$^2$, printing endurance is insufficient, non-image portions of a planographic printing plate are scratched easily. Consequently, so-called “scratch staining” in which ink is adhered to scratched parts in printing tends to occur.

After anodizing treatment, hydrophilization treatment is performed, if necessary, on the surface of aluminum. As such hydrophilization treatment used in the present invention, an alkali metal silicate (for example, sodium silicate aqueous solution) method as disclosed in U.S. Pat. Nos. 2,714,066, 3,181,461, 3,280,734 and 3,902,734 is used. In this method, a substrate is immersed in a sodium silicate aqueous solution or subjected to electrolysis treatment. In addition, methods of treatment with potassium fluorozirconate disclosed in JP-B No. 36-22063, and polyvinylphosphonic acid disclosed in U.S. Pat. Nos. 3,276,868, 4,153,461 and 4,689,272, and other methods are used.

A primer layer can also be provided, if necessary, between a substrate and a polymer layer. Various organic compounds are used as a component of a primer layer, and selected from, for example, phosphonic acids having an amino group such as carboxymethylcellulose, dextrin, gum Arabic, 2-aminoethylphosphonic acid and the like; organic phosphonic acids such as phenylphosphonic acid optionally having a substituent, naphthylphosphonic acid, alkylphosphonic acid, glycerophosphonic acid, methylenediphosphonic acid, ethylenediphosphonic acid and the like; organic phosphoric acids such as phenylphosphoric acid optionally having a substituent, naphthylphosphoric acid, alkylphosphoric acid and glycerophosphoric acid and the like; organic phosphinic acids such as phenylphosphinic acid optionally having a substituent, naphthylphosphinic acid, alkylphosphinic acid, glycerophosphinic acid and the like; amino adis such as glycine, β-alanine and the like; hydrochlorides of amines having a hydroxyl group such as a hydrochloride of triethanolamine and the like, and they may also be mixed and used.

Further, in the present invention, a polyfunctional amine compound can also be added to a primer layer as described above. In this case, a primer layer may be formed together with the above-mentioned other organic compounds, or a primer layer may be formed only of a polyfunctional amine compound.

The coating amount of a primer layer is suitably from 2 to 200 mg/m$^2$, and preferably from 5 to 100 mg/m$^2$. When the above-mentioned coating amount is less than 2 mg/m$^2$, sufficient printing endurance may not be obtained. The same tendency arises also when the coating amount is over 200 mg/m$^2$.

The produced planographic printing plate is usually subjected to image-wise exposure and development treatment, to produce a plate.

The light source of the active beam used in the image-wise exposure is preferably a light source having a light emitting wavelength in a near infrared to infrared region, and solid laser and semiconductor laser are particularly preferable. For locally controlling the film hardness of a recording layer which is a characteristic of the planographic printing plate of the present invention, control of film hardness can be conducted more effectively by controlling the output energy of infrared laser used in this exposure, and consequently controlling light quantity of laser which can reach deeper portions, in addition to the above-mentioned control of the optical density of a recording layer.

Developer

As the developer and replenisher used in development of the planographic printing plate of the present invention, conventionally known alkali developers containing the following components can be used, and preferably, those manifesting low permeability into a recording layer after hardening are used.

The extent of permeability into this recording layer can be detected by change of electrostatic capacity. An example of the method of measuring electrostatic capacity which indicates permeability in the present invention is one in which an aluminum substrate carrying thereon a hardened recording layer is immersed as one electrode in a developer, a conductor is connected to the aluminum substrate, and a conventional electrode is used as another electrode, and voltage is applied, as shown in FIG. 1. When the voltage is applied initially, a recording layer functions as an insulation layer and electrostatic capacity does not change. However, with the lapse of immersion time, a developer permeates into the interface between a substrate and a recording layer, and the electrostatic capacity changes. When time until this change in electrostatic capacity is longer., permeability is judged to be low.

Figure 2:
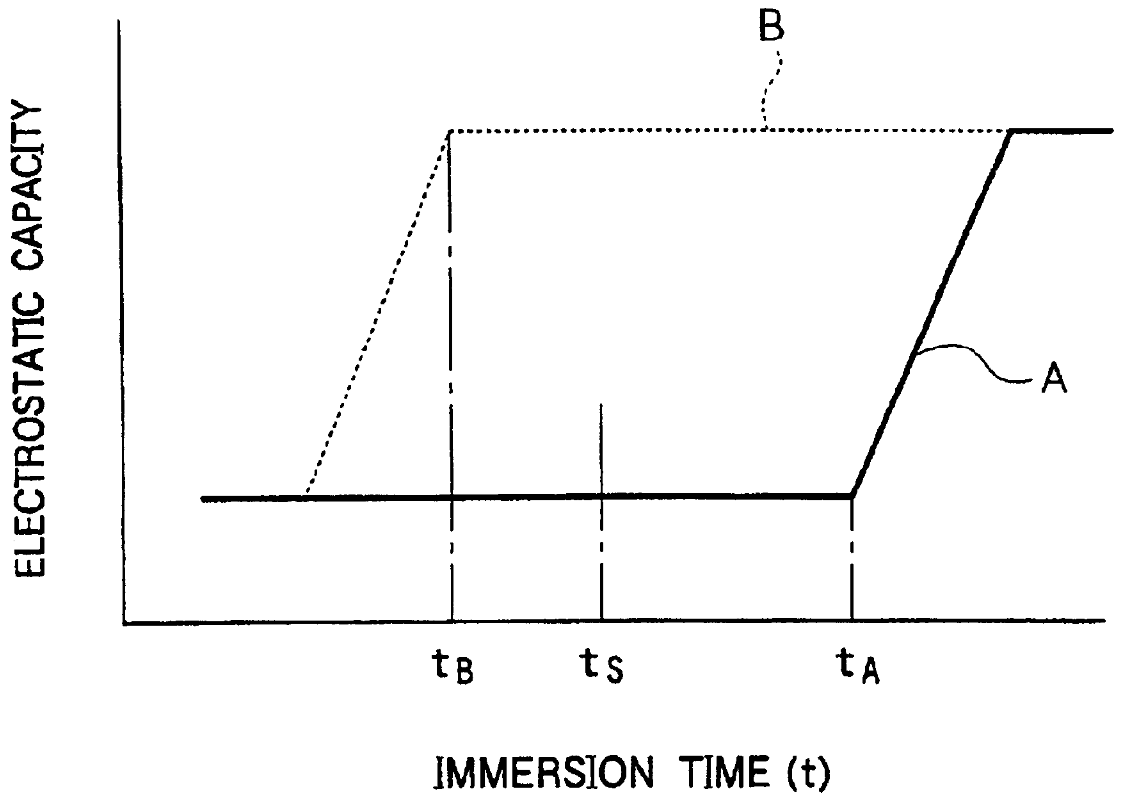
FIG. 2 is a graph showing a relation between an immersion time of a planographic printing plate into a typical developer (voltage application time) and electrostatic capacity of the developer.

FIG. 2 is a graph showing a relation between immersion time (voltage application time) and electrostatic capacity. Time $t_s$ represents time of usual development conducted using an automatic developing machine. In a graph A represented by solid line, time $t_A$ is required for a change in electrostatic capacity to take place, and is longer than usual development time $t_s$. Therefore, in usual development, damage of hardened image portions and decrease in printing endurance do not occur. On the other hand, in a graph B represented by the broken line, only time $t_B$ is necessary for the electrostatic capacity to change, and it is shorter than usual development time $t_S$. Therefore, it is estimated that, in usual development, a developer permeates into the interface between a substrate and a recording layer, to cause reduction in close adherence at the interface, thus causing peeling of image portions.

Since usual development time $t_s$ is from about 5 seconds to about 60 seconds, it is preferable to use a developer having such permeability that time required until change in electrostatic capacity is 60 seconds or more, and preferably 90 seconds or more.

Such control of permeability can be conducted by regulating the compounding amount of components of a developer which are listed below.

Components usually used in a developer will be described below.

Alkali Agent

The developer and development replenisher used in development in the method of producing a planographic printing plate of the present invention are an alkali aqueous solution having a pH of from 9.0 to 13.5, more preferably from 10.0 to 13.3.

As such developer and development replenisher, conventionally known alkali aqueous solutions can be used. For example, organic alkali agents such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium bicarbonate, potassium bicarbonate, ammonium bicarbonate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide, and the like can be used. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and the like are also used.

Of these alkali agents, preferable are aqueous solutions of silicates such as sodium silicate, potassium silicate and the like. The reason for this is that controlling pH and developing property are possible by regulating the ratio of silicon oxide $Sio_2$ which is a component of a silicate to an alkali metal oxide $M_2O$ (generally represented by $[SiO_2]/[M_2O]$ molar ratio) and by regulating concentration. For example, an alkali metal silicate composed of an aqueous solution of potassium silicate having a $SiO_2/K_2O$ molar ratio of 0.5 to 2.0 (namely, $[SiO_2]/[K_2O]$ is 0.5 to 2.0) and a $SiO_2$ content of 1 to 4% by weight is suitably used in the present invention.

Further, examples of other preferable alkali agents include buffer solutions composed of a weak acid and strong base are listed. As the weak acid used in such buffering solutions, those having an acid dissociation constant (pKa) of 10.0 to 13.3 are preferable, and particularly, those having a pKa of 11.0 to 13.1 are preferable. In the case, for example, of sulfosalicylic acid, tertiary dissociation constant is 11.7, and it can be suitably used in the present invention. Namely, a polybasic acid, can be used in the present invention providing at least one acid dissociation constant is within the above-mentioned range.

Such a weak acid is selected from those described in Pergamon Press, IONISATION CONSTANTS OF ORGANIC ACIDS INAQUEOUS SOLUTION, and the like, and examples include alcohols such as 2,2,3,3-tetrafluoropropanol-1 (pKa 12.74), trifluoroethanol (pKa 12.37), trichloroethanol (pKa 12.24) and the like; aldehydes such as pyridine-2-aldehyde (pKa 12.68), pyridine-4-aldehyde (pKa 12.05) and the like; saccharides such as sorbitol (pKa 13.0), saccharose (pKa 12.7), 2-deoxyribose (pKa 12.61), 2-deoxyglucose (pKa 12.51), glucose (pKa 12.46), galactose (pKa 12.35), arabinose (pKa 12.34), xylose (pKa 12.29), fructose (pKa 12.27), ribose (pKa 12.22), mannose (pKa 12.08), L-ascorbic acid(pKa 11.34) and the like; compounds having a phenolic hydroxyl group such as salicylic acid (pKa 13.0), 3-hydroxy-2-naphthoic acid (pKa 12.84), catechol (pKa 12.6), gallic acid (pKa 12.4), sulfosalicylic acid (pKa 11.7), 3,4-dihydroxysulfonic acid (pKa 12.2), 3,4-dihydroxybenzoic acid (pKa 11.94), 1,2,4-trihydroxybenzene (pKa 11.82), hydroquinone (pKa 11.56), pyrogallol (pKa 11.34), resorcinol (pKa 11.27) and the like; oximes such as 2-butanoneoxime (pKa 12.45), acetoxime (pKa 12.42), 1,2-cycloheptanedionedioxime (pKa 12.3), 2-hydroxybenzaldehydeoxime (pKa 12.10), dimethylglyoxime (pKa 11.9), ethanediamidedioxime (pKa 11.37), acetophenoneoxime (pKa 11.35) and the like; amino acids such as 2-quinolone (pKa 11.76), 2-pyridone (pKa 11.65), 4-quinolone (pKa 11.28), 4-pyridone (pKa 11.12), 5-aminovaleric acid (pKa 10.77), 2-mercaptoquinoline (pKa 10.25), 3-aminopropionic acid (pKa 10.24) and the like; nucleic acid associated substances such as fluorouracil (pKa 13.0), guanosine (pKa 12.6), uridine (pKa 12.6), adenosine (pKa 12.56), inosine (pKa 12.5), guanine (pKa 12.3), cytidine (pKa 12.2), cytosine (pKa 12.2), hypoxanthin (pKa 12.1), xanthin (pKa 11.9) and the like; and in addition, weak acids such as diethylaminomethylphosphonic acid (pKa 12.32), 1-amino-3,3,3-trifluorobenzoic acid (pKa 12.29), isopropylidenediphosphonic acid (pKa 12.10), 1,1-ethylidenediphosphonic acid (pKa 11.54), 1-hydroxy 1,1-ethylidenediphosphonate (pKa 11.52), benzimidazole (pKa 12.86), thiobenzamide (pKa 12.8), picolinethioamide (pKa 12.55), barbituric acid (pKa 12.5) and the like.

As the strong base to be combined with these weak acids, sodium hydroxide, ammonium hydroxide, potassium hydroxide and lithium hydroxide are used.

These alkali agents are used alone or in combination of two or more. Among these alkali buffering agents, preferable are those obtained by combining sulfosalicylicacid, salicylicacid, saccharose and sorbitol with sodium hydroxide and potassium hydroxide. Among others, a preferable combination is sorbitol with potassium hydroxide or sodium hydroxide.

The pH of the above-mentioned various alkali agents is controlled within a preferable range by concentration and combination, before use thereof.

When organic amines are used as the organic alkali agent, the use amount thereof used is preferably 1% by weight or less from the standpoint of appropriate permeability.

Surfactant

To the developer and replenisher used in the present invention, various surfactants and organic solvents can be added, if necessary, for the purpose of promoting developing property, dispersing development foreign matters, and enhancing ink affinity of printed image portions. Preferable surfactants are anionic, cationic, nonionic and ampholytic surfactants.

As preferable examples of the surfactant, there are listed nonionic surfactants such as polyoxyethylene alkyl ethers, polyoxyethylene alkylphenyl ethers, polyoxyethylene polystyrylphenyl ethers, polyoxyethylene polyoxypropylene-alkyl ethers, glycerin fatty acid partial esters, sorbitan fatty acid partial esters, pentaerythritol fatty acid partial esters, propylene glycol monofatty esters, saccharose fatty acid partial esters, polyoxyethylene sorbitan fatty acid partial esters, polyoxyethylene sorbitol fatty acid partial esters, polyethylene glycol fatty esters, polyglycerin fatty acid partial esters, polyoxyethylenized castor oils, polyoxyethylene glycerin fatty acid partial esters, fatty acid diethanolamides, N,N-bis-2-hydroxyalkylamines, polyoxyethylenealkylamine, triethanolaminefatty esters, trialkylamine oxides and the like; anionic surfactants such as fatty acid salts, abietic acid salts, hydroxyalkanesulfonic acid salts, alkanesulfonic acid salts, dialkylsulfosuccinate salts, alkylnaphthalenesulfonic acid salts, alkylphenoxy-polyoxyethylenepropylsulfonic acid salts, polyoxyethylene akylsulfophenyl ether salts N-methyl-N-oleyltaurin sodium salt, N-alkylsulfosuccinic monoamide disodium salts, petroleum sulphonic acid salts, sulfated beef tallow oil, sulfate salts of fatty acid alkyl esters, alkyl sulfate salts, polyoxyethylene alkyl ether sulfate salts, fatty monoglyceride sulfate salts, polyoxyethylene alkylphenyl ether sulfate salts, polyoxyethylene styrylphenyl ether sulfate salts, alkylphosphate salts, polyoxyethylene alkyl ether phosphate salts, polyoxyethylene alkylphenyl ether phosphate salts, partial saponified substances of styrene/maleic anhydride copolymers, partial saponified substances of olefin/maleic anhydride copolymers, naphthalenesulfonic acid salt formalin condensates and the like; cationic surfactants such as alkylamine salts, quaternary ammonium salts such as tetrabutylammonium bromide and the like, polyoxyethylenealkylamine salts, polyethylenepolyamine derivatives and the like; and ampholytic surfactants such as carboxybetaines, aminocarboxylic acids, sulfobetaines, aminosulfates, imidazolines and the like. Of the above-listed surfactants, the polyoxyethylene can also be regarded as polyoxyalkylenes such as polyoxymethylene, polyoxypropylene, polyoxybutylene and the like, and surfactants thereof are also included.

Further preferable surfactants are fluorine-based surfactants containing a perfluoroalkyl group in the molecule. Examples of such a fluorine-based surfactant are anionic surfactants such as perfluoroalkylcarboxylic acid salts, perfluoroalkylsulfonic acid salts, perfluoroalkylphosphates and the like; ampholytic surfactants such as perfluoroalkylbetaine and the like; cationic surfactants such as perfluoroalkyltrimethylammonium salts and the like; and nonionic surfactants such as perfluoroalkylamine oxide, perfluoroalkyl ethylene oxide adducts, perfluoroalkyl group and hydrophilic group-containing oligomers, perfluoroalkyl group and lipophilic group-containing oligomers, perfluoroalkyl group, hydrophilic group and lipophilic group-containing oligomers, perfluoroalkyl group and lipophilic group-containing urethane, and the like.

The above-mentioned surfactants can be used alone or in combination of two or more, and added into a developer in an amount of 0.001 to 10% by weight, more preferably of 0.01 to 5% by weight.

Development Stabilizer

In the developer and replenisher used in the present invention, various development stabilizer are used, and as preferable examples thereof are polyethylene glycol adducts of sugar alcohol described in JP-B No. 6-282979, tetraalkylammonium salts such as tetrabutylammonium hydroxide and the like, phosphonium salts such as tetrabutylphosphonium bromide and the like, and iodonium salts such as diphenyl iodonium chloride and the like.

Further, there are anionic surfactants or ampholytic surfactants described in JP-A No. 50-51324, water-soluble cationic polymers described in JP-A No. 55-95946, and water-soluble ampholytic polymer electrolytes described in JP-A No. 56-142528.

Further, other examples include organic boron compounds having alkylene glycol added described in JP-A No. 59-84241, water-soluble surfactants of polyoxyethylene, polyoxypropylene block polymer type described in JP-A No. 60-111246, alkylenediamine compounds obtained by substitution of polyoxyethylene-polyoxypropylene described in JP-A No. 60-129750, polyethylene glycols having a weight-average molecular weight of 300 or more described in JP-A No. 61-215554, fluorine-containing surfactants having a cationic group described in JP-A No. 63-175858, water-soluble ethylene oxide adducts obtained by addition of 4 or more mol of ethylene oxides to an acid or alcohol described in JP-A No. 2-39157, water-soluble polyalkylene compounds and the like.

Organic Solvent

To the developer and replenisher, an organic solvent is added if necessary. As such an organic solvent, those having a solubility in water of about 10% by weight or less are suitable, and it is preferably selected from those having a solubility in water of about 5% by weight or less. Example include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol and 4-methylcyclohexanol, N-phenylethanolamine, N-phenyldiethanolamine and the like. The content of an organic solvent is from 0.1 to 5% by weight based on the total weight after used. The amount thereof used has a close relation ship with the use amount of a surfactant used, and it is preferable to allow the amount of a surfactant to increase when the amount of an organic solvent increases. The reason for this is that when the amount of a surfactant is small, and a large amount of an organic solvent is used, the organic solvent is not dissolved completely. Consequently, excellent developing property can not be secured.

Reducing Agent

To the developer and replenisher used in the present invention, a reducing agent is further added. This prevents pollution of a printing plate, and is effective particularly in developing a negative photosensitive planographic printing plate containing a photosensitive diazonium salt compound. Examples of preferable organic reducing agent include phenol compounds such as thiosalicylic acid, hydroquinone, methol, methoxyquinone, resorcin, 2-methylresorcin and the like, and amine compounds such as phenylenediamine, phenylhydrazine and the like. Examples of further preferable inorganic reducing agents include sodium salts, potassium salts and ammonium salts of inorganic acids such as sulfurous acid, hydrogensulfite, phosphorous acid, hydrophosphorous acid, dihydrophosphorous acid, thiosulfuric acid, dithionous acid and the like. Of these reducing agents, a sulfite has a particularly excellent contamination prevention effect. The reducing agents are contained preferably in an amount of 0.05 to 5% by weight based on a developer in use.

Organic Carboxylic Acid

To the developer and replenisher used in the present invention, also an organic carboxylic acid can further be added. Preferable are aliphatic carboxylic acids and aromatic carboxylic acids having 6 to 20 carbon atoms. As the specific examples of the aliphatic carboxylic acid, capronic acid, enanthic acid, caprylic acid, lauric acid, myristic acid, palmitic acid, stearic acid and the like, and alkanic acids having 8 to 12 carbon atoms are particularly preferable. Any of unsaturated fatty acids having a double bond in a carbon chain or branched carbon chains is permissible.

The aromatic carboxylic acid is a compound obtained by substitution of a carboxyl group on a benzene ring, naphthalene ring, anthracene ring or the like, and specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybeozoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, 2-naphthoic acid and the like, and hydroxynaphthoic acid is particularly effective.

The above-mentioned aliphatic and aromatic carboxylic acid are preferably used as a sodium salt, potassium salt or ammonium salt for enhancing water-solubility. The content of an organic carboxylic acid in a developer used in the present invention is not particularly restricted, however, when it is less than 0.1% by weight, a sufficient effect is not obtained, and when 10% by weight or more, a further effect can not be attained and additionally, dissolving may be prevented when other additive is used together. Therefore, the addition amount is preferably 0.1 to 10% by weight, more preferably from 0.5 to 4% by weight based on a developer in use.

Other Components

The developer and replenisher used in the present invention can further contain a de-foaming agent, water softener and the like, if necessary. Examples of the water softener include polyphosphoric acid and sodium, potassium and ammonium salts thereof, aminopolycarboxylic acids such as ethylenediaminetetraacetic acid, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid, 1,3-diamino-2-propanoltetraacetic acid and the like and sodium, potassium and ammonium salts thereof, aminotri(methylenephosphonic acid), ethylenediaminetetra(methylenephosphonic acid), diethylenetriaminepenta(methylenephosphonic acid), triethylenetetraminehexa(methylenephosphonic acid), hydroxyethylethylenediaminetri(methylenephosphonic acid) and 1-hydroxyethane-1,1-diphosphonic acid and sodium, potassium and ammonium salts thereof.

Though the optimum amount of such a water softener used varies depending on the chelating force thereof, the hardness of hard water used and the amount of hard water, and general amount used there of is from 0.01 to 5% by weight, and more preferably from 0.01 to 0.5% by weight based on a developer used. When the addition amount is below this range, the desired object is not attained sufficiently, and when the addition amount is over this range, reverse effects on image portions such as decoloring and the like arise.

The residual component in the developer and replenisher is water. However, if necessary, various additives known in the art can be contained.

It is advantageous that the original development replenishing raw solution and replenisher used in the present invention are prepared as concentrated solutions containing a smaller amount of water than when in use, and that they are diluted with water when in use, from the standpoint of transportation. It is suitable that the degree of concentration in this case is such that components do not cause separation and deposition.

The temperature of a developer is preferably from 15 to 4° C., and further preferably from 20 to 35° C. The development time is preferably from 5 to 60 seconds, and further preferably from 7 to 40 seconds.

A planographic printing plate subjected to development treatment using the above-mentioned developer and replenisher is subjected to post-treatment with washing water, a rinse solution containing a surfactant and the like, or a desensitizing solution containing gum Arabic and a starch derivative. For post-treatment in the case of useing the planographic printing plate of the present invention produced by the above-mentioned method, the above-mentioned treatments can be combined variously and used.

In the method of plate production of the present invention, development is conducted using a developer of which permeability into a hardened recording layer has been regulated as described above. Therefore, parts in the vicinity of the surface having high film hardness effectively prevent permeation of a developer, and an image having high sensitivity and excellent discrimination can be formed without reduction in printing endurance.

Recently, automatic developing machines for a printing plate are widely used for rationalization and standardization of plate production operation, in plate production and printing industries. A planographic printing plate obtained according to the present invention can also be treated using this automatic developing machine. This automatic developing machine is, in general, composed of a development section and a post treatment section, and comprises an apparatus for transporting a printing plate, treating solution vessels, and a spray apparatus, and in which developing treatment is conducted by spraying treating solutions sucked up by a pump through spray nozzles while horizontally transporting a printing plate which has been exposed. Further, recently, there is also known a method in which a printing plate is treated by being immersed and transported by a submerged guide roll in a treating solution vessel filled with a treatment solution. In such automatic treatment, treatment can also be conducted while replenishing a replenishment solution with a treatment solution in accordance with the treatment amount, working time and the like. Further, a so-called disposable treatment method in which treatment is effected with a substantially unused treating solution can also be used.

The planographic printing plate obtained as described above can be, after application of desensitizing gum if necessary, subjected to a printing process. For the purpose of improving printing endurance, burning treatment can be performed. When a planographic printing plate is subjected to burning treatment, it is preferable to conduct treatment with a surface smoothing solution as described in JP-B Nos. 61-2518 and 55-28062, JP-A Nos. 62-31859 and 61-159655, before the burning treatment. As this method, a method in which the surface smoothing solution is applied on a planographic printing plate by using sponge or absorbent cotton soaked with this solution, a method in which a printing plate is immersed in a vat filled with a surface smoothing solution to effect application on the plate, a method using an automatic coater, and the like are applied. Further, a more preferable result is obtained if, after application, the applied amount is made uniform by a squeeze or squeeze roller. The amount of a surface smoothing solution applied is, in general, suitably from 0.03 to 0.8 g/$m^2$ (dry weight).

The planographic printing plate on which a surface smoothing agent has been applied is dried, then, heated to high temperatures by a burning processor (for example, Burning Processor: “BP-1300”, available from Fuji Photo Film Co., Ltd.) and the like. In this case, it is preferable that the heating temperature is from 180 to 300° C. and the heating time is from 1 to 20 minutes depending on the kinds of components forming the images.

The planographic printing plate which has been subjected to burning-treatment can be appropriately subjected, if necessary, to conventionally conducted treatments such as washing with water, gum drawing and the like, and when smoothing liquid containing a water-soluble polymer compound and the like is used, so-called de-sensitizing treatments such as gum drawing and the like can be omitted.

Planographic printing plates obtained by such treatments are put in an offset printing machine and the like, and used in printing of a large number of sheets.

EXAMPLE

The following examples illustrates the present invention, but do not limit the scope of the present invention.

Example 1

Production of Substrate

An aluminum alloy plate (thickness: 0.30 mm) containing 99.5% or more of aluminum, 0.30% of Fe, 0.10% of Si, 0.02% of Ti and 0.013% of Cu was de-greased by washing with trichloroethylene, the surface of which was sand-blasted, and washed sufficiently with water.

This aluminum plate was immersed in a 25% sodium hydroxide aqueous solution (45° C.) for 9 seconds for etching, washed with water, then, further immersed in a 2% $HNO_3$ aqueous solution for 20 seconds and washed with water. The amount of etching of the sand-blasted surface at this point was about 3 g/$m^2$.

Then, a direct current anodized film of 3 g/$m^2$ was provided on the above-mentioned aluminum plate using 7% sulfuric acid as an electrolyte solution, at a current density of 15 A/$dm^2$, and further washed and dried, then, the following application solution for a primer layer was applied thereon, and dried under an atmosphere of 80° C. for 30 seconds. The applied amount after drying was 10 mg/$m^2$.

Preparation of Application Solution for Primer Layer

An application solution for a primer layer was prepared by mixing compounds of the following formulation.

| | |
|---|---|
| 2-aminoethylphosphonic acid | 0.5 g |
| methanol | 40 g |
| pure water | 60 g |

Synthesis of Polymer 2-hydroxyethyl methacrylate, N-(p-sulfamoylphenyl) methacrylamide and methacrylic acid were subjected to radical polymerization by a usual method to give a polymer. Further, the obtained polymer was reacted with 2-methacryloyloxyethyl isocyanate to obtain a polymer (RB-1) of the following formula. The formulation ratio was 50:30:20=x:y:z. The weight-average molecular weight was 120000 (based on polystyrene).

Formation of Recording Layer

The following recording layer application solution was applied by a wire bar on the above-mentioned substrate carrying thereon a primer layer formed, and dried at 120° C. for 45 seconds by a hot air mode drying apparatus to form a recording layer, giving a planographic printing plate of Example 1 [P-1]. The application amount after drying was 1.4 g/$m^2$.

The optical density of this recording layer was measured by using a Hitachi self-recording spectrophotometer (trade name: U-3000, manufactured by Hitachi Ltd.). The measurement was conducted according to a reflection method using an integrating sphere, and a substrate carrying neither primer layer nor recording layer applied was used as reference. The maximum absorption wavelength was about 800 nm, and the optical density was 1.16.

The structures of an infrared absorbing agent and the like used in preparation of the recording layer application solution are as shown below.

| Recording layer application solution [P-1] | |
|---|---|
| Dipentaerythritol hexaacrylate | 0.50 g |
| Monomer (TM-1) | 0.50 g |
| Polymer (RB-1) | 1.00 g |
| Naphthalenesulfonic acid salt of Victoria Pure Blue | 0.04 g |
| p-Methoxyphenol | 0.001 g |
| Fluorine-based surfactant (trade name: Megafac F-176, manufactured by Dainippon Ink & Chemicals, Inc.) | 0.03 g |
| Methyl ethyl ketone | 10 g |
| γ-Butyrolactone | 5 g |
| Methanol | 7 g |
| 1-methoxy-2-propanol | 5 g |

(RB-1)

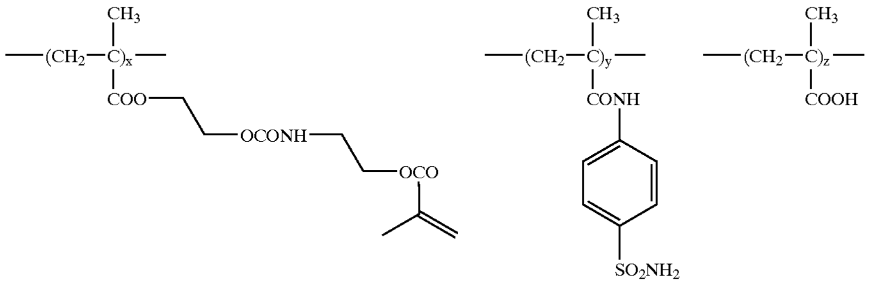

(IR-1)

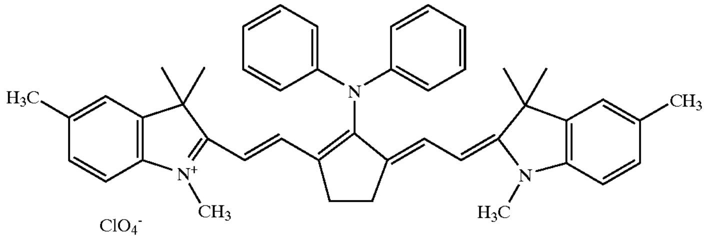

(KO-1)

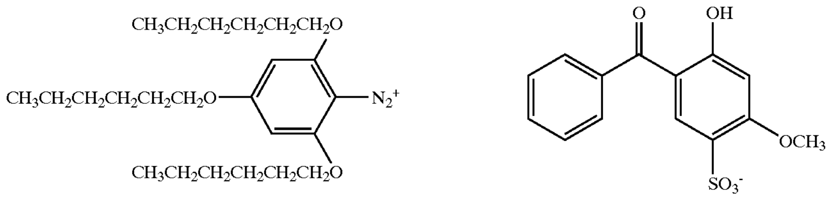

(KO-2)

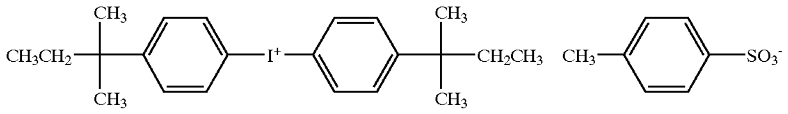

(TM-1)

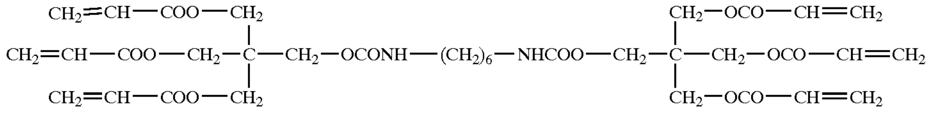

Evaluation of Planographic Printing Plate

1. Evaluation of Film Hardness

The planographic printing plate [P-1] was exposed by Trendsetter 3244 VFS (tradename) manufactured by Creo, at a plate surface energy amount of 80 mJ/cm$^2$. After exposure, film hardness was measured by using an apparatus prepared by amounting a thrusting apparatus (trade name: Triboscope, manufactured by HYSITRON) onto AFM (interatomic force microscope) SPA300 (trade name) manufactured by Seiko Instruments K.K. The film hardness of the upper part of the recording layer was 1.3 GPa, the average film hardness was 0.7 GPa, and the ratio of film hardness was 1.86.

2. Evaluation of Permeability

The planographic printing plate [P-1] was exposed by Trendsetter 3244 VFS (tradename) manufactured by Creo, at a plate surface energy amount of 80 mJ/cm$^2$. After exposure, the plate was immersed into a developer [D-1] shown below at 30-C using 4262A LCR meter (trade name) manufactured by Yokogawa Hewlett Packard K.K., and change in electrostatic capacity was measured. Change in electrostatic capacity occurred 70 seconds after immersion. The developer [D-1] had a pH of 11.8.

| Developer [D-1] | |
|---|---|
| Potassium hydroxide | 3 g |
| Potassium hydrogen carbonate | 1 g |
| Potassium carbonate | 2 g |
| Sodium sulfite | 1 g |
| Polyethylene glycol mononaphthyl ether | 150 g |
| Sodium dibutylnaphthalenesulfonate | 50 g |
| Tetra sodium ethylenediamine tetraacetate | 8 g |
| Water | 785 g |

3. Evaluation of Sensitivity

The planographic printing plate [P-1] was exposed by Trendsetter 3244 VFS (tradename) manufactured by Creo, while changing plate surface energy amount by varying output and revolution of an outer drum. After exposure, the above-mentioned developer was placed as a charging solution into an automatic developing machine (trade name: Stabron 900 NP, manufactured by Fuji Photo Film Co., Ltd.), and the plate was treated by this machine using the following developer [D-2] as a replenisher and further using a 1:1 water diluted solution of FP-2W (trade name, manufactured by Fuji Photo Film Co., Ltd.) as a finisher at a development temperature of 30° C. and a development time of 12 seconds. In this procedure, the replenisher was automatically charged while keeping the electric conductivity of the developer in the developing bath of the automatic developing machine constant. After treatment, the plate surface energy at which a clear solid image could be formed was 80 mJ/cm$^2$.

| Developer [D-2] | |
|---|---|
| Potassium hydroxide | 6 g |
| Potassium carbonate | 2 g |
| Sodium sulfite | 1 g |
| Polyethylene glycol mononaphthyl ether | 150 g |
| Sodium dibutylnaphthalenesulfonate | 50 g |
| Potassium hydroxyethanediphosphonate | 4 g |
| Silicon (trade name: TSA-731, manufactured by Toshiba Silicone K. K.) | 0.1 g |
| Water | 786.9 g |

4. Evaluation of Dot Reproducibility

The planographic printing plate [P-1] was exposed by Trendsetter 3244 VFS (tradename) manufactured by Creo, at a plate surface energy amount of 80 mJ/cm$^2$ and a screen line number of 1751 pi. After exposure, the plate was subjected to development treatment using the same developer and automatic developing machine as in "3. Evaluation of sensitivity.

5. Evaluation of Printing Endurance

The planographic printing plate [P-1] was exposed by Trendsetter 3244 VFS (tradename) manufactured by Creo, at a plate surface energy amount of 80 mJ/cm$^2$. After exposure, the plate was subjected to development treatment using the same developer and automatic developing machine as in "3. Evaluation of sensitivity". The obtained planographic printing plate was set on a printer (trade name: Risron, manufactured by Komori Corporation), and printing was conducted using commercially available eco-ink and high quality paper, to obtain 100000 pieces of prints containing no blank part in image portions and causing no contamination in non-image portions.

Comparative Example 1

A planographic printing plate [S-1] of Comparative Example 1 was obtained in the same manner as in Example 1 except that an application solution for a recording layer [S-1] prepared without using an infrared absorbing agent (IR-1) was used in the application solution for a recording layer [P-1] used in Example 1.

The optical density of this recording layer was measured in the same manner as in Example 1. There was no maximum absorption wavelength, and the optical density at 750 nm to 800 nm was 0.05.

1. Evaluation of Film Hardness

The planographic printing plate [P-1] was exposed by Trendsetter 3244 VFS (tradename: manufactured by Creo) at a plate surface energy amount of 80 mJ/cm$^2$. After exposure, film hardness was measured in the same manner as in Example 1. The film hardness of the upper part of the recording layer was 0.7 GPa, the average film hardness was 0.7 GPa, and the ratio of film hardness was 1.0.

2. Evaluation of Sensitivity

The planographic printing plate [P-1] was exposed by Trendsetter 3244 VFS (tradename: manufactured by Creo) while changing plate surface energy amount by varying output and revolution of an outer drum. After exposure, the above-mentioned developer was placed as a charging solution into an automatic developing machine (trade name: Stabron 900 NP, manufactured by Fuji Photo Film Co., Ltd.), and the plate was developed by this machine using the following developer [D-2] as a replenisher and further using a 1:1 water diluted solution of FP-2W (trade name, manufactured by Fuji Photo Film Co., Ltd.) as a finisher. In this procedure, the replenisher was automatically charged while keeping the electric conductivity of the developer in the developing bath of the automatic developing machine constant.

After development, the plate surface energy at which a clear solid image could be formed was measured. However, image could not be formed even at an energy of 300 mJ/cm$^2$.

Thus, it was found that the planographic printing plate of Comparative Example 1 which has no difference between film hardness in the upper portion and average film hardness is inferior in sensitivity as compared with this example.

Comparative Example 2

The planographic printing plate [S-1] produced in Comparative Example 1 was exposed and evaluated.

1. Evaluation of Film Hardness

The planographic printing plate [S-1] was exposed to ultraviolet ray by a PS printer having a high pressure mercury lamp mounted. After exposure, film hardness was measured in the same manner as in Comparative Example 1. The film hardness of the upper portion of the recording layer was 1.1 GPa, the average film hardness was 1.0 GPa, and the ratio of film hardness was 1.1.

2. Evaluation of Dot Reproducibility

The planographic printing plate [S-1] was exposed to ultraviolet rays by a PS printer having a high pressure mercury lamp mounted, through a dot film having a screen line number of 1751 pi. After exposure, the plate was subjected to development treatment in the same manner as in Example 1. The minimum dots and the maximum dots which could be reproduced on the obtained planographic printing plate were observed using a loupe. Up to 3% of the minimum dots could be reproduced and up to 95% of the maximum dots could be reproduced. It was found that the dot reproducibility was poorer than in Example 1 in which an image was formed by infrared laser even if the reproducible minimum dot is larger, the reproducible maximum dot is small, and ultraviolet rays of higher energy is used for formation of an image.

Example 2

Production of Substrate

A molten bath of an aluminum alloy containing 99.5% or more of aluminum, 0.30% of Fe, 0.10% of Si, 0.02% of Ti and 0.013% of Cu was subjected to purification treatment and molded. For the purification, de-gassing treatment was effected and ceramic tube filter treatment was conducted for removing unnecessary gases such as hydrogen and the like in the molded bath. The molding was effected according to a DC molding method. A fragment of 10 mm was cut from the surface of the coagulated ingot having a plate thickness of 500 mm, and subjected to homogenization treatment at 550° C. for 10 hours so that intermetallic compounds did not increase in size. Then, the fragment was hot-rolled at 400° C. and annealed in a continuous annealing furnace at 500° C. for 60 seconds, then, cold-rolled to obtain an aluminum rolled plate having a thickness of 0.30 mm. By controlling the roughness of the roll, the average surface roughness Ra at the center line after cold-rolling was controlled to 0.2 μm. Then, the plate was subjected to a tension leveler for improvement in flatness.

Next, surface treatment was conducted for obtaining a substrate of a planographic printing plate.

First, to remove a rolling oil on the surface of the aluminum plate, the plate was de-greased with a 10% sodium aluminate aqueous solution at 50° C. for 30 seconds, and neutralized with a 30% sulfuric acid aqueous solution at 50° C. for 30 seconds, and subjected to smut removal treatment.

Then, to improve close adherence between a substrate and a photosensitive layer and to impart water-retaining property to non-image portions, treatment to roughen the surface of a substrate, namely a so-called sand-blasting treatment was conducted. Electrolytic sand-blasting was effected while keeping the temperature of an aqueous solution containing 1% of nitric acid and 0.5% of aluminum nitrate at 45° C., flowing an aluminum web in the aqueous solution, and applying an anode side electric quantity of 240 C/$dm^2$ at alternating wavelength of duty ratio of 1:1 and a current density of 20 A/$dm^2$ by an indirect electricity feeding cell. Then, the plate was subjected to etching treatment at 50° C. for 30 seconds with a 10% sodium aluminate aqueous solution, and neutralized with a 30% sulfuric acid aqueous solution at 50° C. for 30 seconds, and subjected to smut removal treatment.

For further improving friction resistance, chemical resistance and water retaining property, an oxide film was formed on a substrate by carrying out anodizing. A 20% sulfuric acid aqueous solution was used as an electrolyte at 35° C., an anodized film of 2.5 g/$M^2$ was formed by conducting electrolysis treatment at a direct current of 14 A/$dm^2$ by an indirect electricity feeding cell while transporting an aluminum web through the electrolyte.

Then, for securing hydrophilicity necessary for the printing plate non-image portion, silicate treatment was conducted. In this treatment, a 1.5% aqueous solution of No. 3 sodium silicate was kept at 70° C. and an aluminum web was transported so that the contact time was 15 seconds, and water washing was further effected. The amount of Si adhered was 10 mg/$m^2$. Ra (surface roughness at center line) of the substrate produced as described above was 0.25 μm.

Priming

Then, the following primer solution 2 was applied by a wire bar on this aluminum substrate, and dried at 90° C. for 30 seconds using a hot air drying apparatus. The coated amount after drying was 10 mg/$m^2$.

| Primer solution 2 | |
|---|---|
| Copolymer of ethyl methacrylate and sodium 2-acrylamide-2-methyl-1-propanesulfonate of molar ratio of 75:15 | 0.1 g |
| 2-aminoethylphosphonic acid | 0.1 g |
| Methanol | 50 g |
| Ion exchange water | 50 g |

Formation of Recording Layer

Then, the following recording layer application solution [P-2] was prepared and was applied by a wire bar on the above-mentioned primed aluminum plate, and dried at 115° C. for 45 seconds by a hot air drying apparatus to form a recording layer. The application amount after drying was in a range from 1.2 to 1.3 g/$m^2$.

The optical density of this recording layer was measured in the same manner as in Example 1. It was found that, the optical density was 0.98 at the maximum absorption wavelength of about 810 nm.

| Recording layer application solution [P-2] | |
|---|---|
| Infrared absorbing agent (IR-2) | 0.08 g |
| Onium salt (KO-3) | 0.20 g |
| Trihalomethyl compound (TH-1) | 0.10 g |
| Dipentaerythritol hexaacrylate | 1.00 g |
| Copolymer of allyl methacrylate and methacrylic acid (molar ratio 80:20, weight-average molecular weight 140000) | 1.00 g |
| Naphthalenesulfonate salt of Victoria Pure Blue | 0.04 g |
| Hydroquinone | 0.001 g |
| Silicon-based surfactant (trade name: TEGO GLIDE100, manufactured by TEGO Chemiservice) | 0.03 g |
| Methyl ethyl ketone | 10 g |
| Methyl isobutyl ketone | 5 g |
| Methanol | 7 g |
| 1-methoxy-2-propanol | 5 g |
| Water | 1 g |

(IR-2)

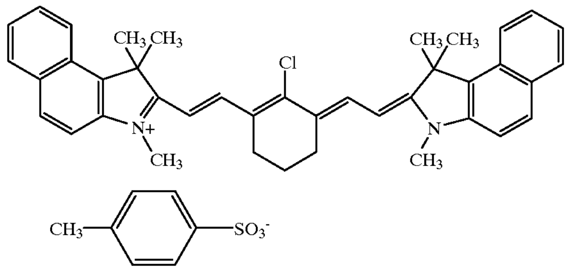

(KO-3)

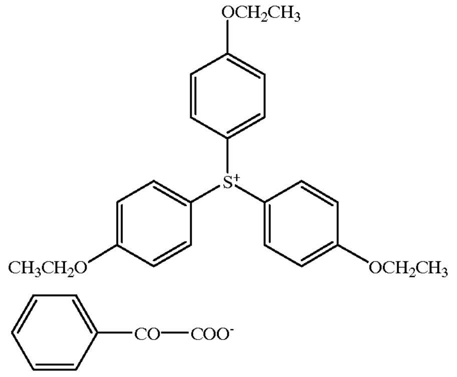

(TH-1)

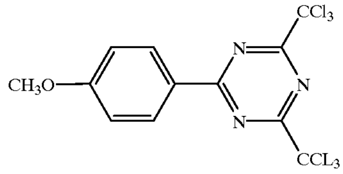

Formation of Over Coat Layer

Then, the following application solution for an over coat layer was prepared, and was applied by a wire bar on the above-mentioned aluminum plate having a recording layer formed, and dried at 100° C. for 3 seconds by a hot air drying apparatus to form an over coat layer, giving a negative planographic printing plate [P-2] which is Example 2. The application amount after drying was 2.2 g/$m^2$.

| Over coat layer application solution | |
|---|---|
| Polyvinyl alcohol (degree of saponification 98.5 mol %, degree of polymerization 500) | 20 g |
| Polyvinylpyrrolidone (trade name: K30, manufactured by Tokyo Kasei Kogyo K. K., molecular weight = 40000) | 2 g |
| Nonionic surfactant (trade name; EMALEX NP-10, manufactured by Nippon Emulsion K. K) | 0.5 g |
| Distilled water | 470 g |

1. Evaluation of Film Hardness

The planographic printing plate [P-1] was exposed by Trendsetter 3244 VFS (tradename: manufactured by Creo) at a plate surface energy amount of 100 mj/cm$^2$. After exposure, the over coat layer was peeled, then, the film hardness was measured in the same manner as in Example 1. The film hardness of the upper part of the recording layer was 1.2 GPa, the average film hardness was 0.6 GPa, and the ratio of film hardness was 2.0.

2. Evaluation of Dot Reproducibility

The planographic printing plate [P-2] was exposed by Trendsetter 3244 VFS (tradename) manufactured by Creo, at a plate surface energy amount of 100 mj/cm$^2$ and a screen line number of 1751 pi. After exposure, the above-mentioned developer [D-1] was placed as a charging solution into an automatic developing machine (trade name) Stabron 900 NP, manufactured by Fuji Photo Film Co., Ltd., and the plate was treated by this machine using the above-mentioned developer [D-2] as a replenisher and further using a burning developer DC-5 (trade name, manufactured by Fuji Photo Film Co., Ltd.) as a finisher at a development temperature of 30° C. and a development time of 12 seconds. In this procedure, the replenisher was automatically charged while keeping the pH of the developer in the developing bath of the automatic developing machine constant. Then, the plate was subjected to burning treatment at 200° C. for 5 minutes, washed with water, and gum solution GU-7 (trade name) manufactured by Fuji Photo Film Co., Ltd., was applied on this. The minimum dots and the maximum dots which could be reproduced on the obtained planographic printing plate were observed using a loupe. 1% of the minimum dots were reproduced and 99% of the maximum dots were reproduced. Both of the minimum dots and the maximum dots were excellent in reproducibility.

Reference Example

1. Evaluation of Permeability

The planographic printing plate [P-2] obtained in Example 2 was exposed by Trendsetter 3244 VFS (tradename, manufactured by Creo, at a plate surface energy amount of 100 mj/cm$^2$. After exposure, the plate was immersed into a developer [E-1] shown below at 30° C., and change in electrostatic capacity was measured. Change in electrostatic capacity occurred 5 seconds after immersion.

| Developer [E-1] | |
|---|---|
| Potassium hydroxide | 3 g |
| Triethanolamine | 50 g |
| Sodium dibutylnaphthalenesulfonate | 50 g |
| Tetra sodium ethylenediamine tetraacetate | 8 g |
| Water | 889 g |

2. Evaluation of Dot Reproducibility

The planographic printing plate [S-1] was exposed by Trendsetter 3244 VFS (tradename: manufactured by Creo) at a plate surface energy amount of 100 mj/cm$^2$ and a screen line number of 1751 pi. After exposure, a planographic printing plate was obtained in the same manner as in Example 2 except that Stabron 900 NP (manufactured by Fuji Photo Film Co., Ltd.) was used as the automatic developing machine and the above-mentioned developer [E-1] was used as the charging solution and replenisher. The minimum dots and the maximum dots which could be reproduced on the obtained planographic printing plate were observed using a loupe. Up to 4% of the minimum dots could be reproduced and up to 95% of the maximum dots could be reproduced. When development was thus conducted by using the developer [E-1] having higher permeability into a recording layer, it was found that the reproducible minimum dot is larger and the reproducible maximum dot was smaller, namely, the results are somewhat inferior, as compared with the evaluation results in Example 2 in which the developer [D-1] having suitable permeability was used in development.

The negative planographic printing plate of the present invention has the effects of realizing direct plate production based on digital data from a computer and the like using solid laser and semiconductor laser emitting infrared rays, and has higher sensitivity to the above-mentioned infrared layer, and in which ablation in a recording layer in recording is suppressed, and image forming properties such as dot reproducibility and the like, and printing endurance are excellent. Further, by applying the method of producing a planographic printing plate of the present invention to the above-mentioned negative planographic printing plate, a planographic printing plate having excellent image forming properties such as dot reproducibility and the like, and printing endurance can be obtained.

What is claimed is:

1. A negative planographic printing plate precursor capable of being recorded by infrared laser exposure conducted at a plate energy amount of 80 mJ/cm$^2$ or more, comprising a substrate carrying thereon a recording layer wherein: the recording layer contains a polymerizable compound and an infrared absorbing agent, and a polymerization reaction caused by the action of light or heat decreases solubility of the recording layer in an alkali developer wherein; the optical density of said recording layer is in a range from 0.4 to 2.0; and the film hardness of the upper portion of said recording layer after solubility in an alkali developer is reduced due to the action of light or heat is higher than the average film hardness of the whole recording layer.

2. A negative planographic printing plate precursor according to claim 1, wherein said recording layer contains an infrared absorbing agent under conditions where ablation does not occur.

3. A negative planographic printing plate precursor according to claim 1, wherein said recording layer contains (A) an infrared absorbing agent, (B) a radical generator and (C) a radical-polymerizable compound which causes a polymerization reaction with the generated radical, said polymerization reaction causing hardening.

4. A negative planographic printing plate precursor according to claim 3, wherein said recording layer further contains (D) a binder polymer.

5. A negative planographic printing plate precursor according to claim 1, wherein the optical density of said recording layer is in a range from 0.6 to 1.6.

6. A negative planographic printing plate precursor according to claim 1, wherein the ratio of the film hardness of the upper part of said recording layer to the average film hardness is 1.2 or more.

7. A negative planographic printing plate precursor according to claim 3, wherein said infrared absorbing agent (A) is selected from the group consisting of cyanine colorants, squarylium colorants, pyrylium salts, and nickel thiolate complexes.

8. A negative planographic printing plate precursor according to claim 3, wherein said radical generator (B) is an onium salt.

9. A method of producing a negative planographic printing plate which comprises a step of exposing, with an infrared laser conducted at a plate energy amount of 80 $mJ/cm^2$ or more, a planographic printing plate precursor containing a substrate carrying thereon a recording layer which contains a polymerizable compound and an infrared absorbing agent, and in which a polymerization reaction caused by the action of light or heat decreases solubility of the recording layer in an alkali developer, the optical density of said recording layer is in a range from 0.4 to 2.0, and the film hardness of the upper part of said recording layer after reduction in solubility in an alkali developer due to the action of light or heat is higher than the average film hardness of the recording layer, and a step of developing the plate with a developer, the alkali developer being less capable of permeating through the recording layer after said recording layer is hardened by exposure.

10. A method of producing a negative planographic printing plate according to claim 9, wherein said recording layer contains an infrared absorbing agent under conditions where ablation does not occur.

11. A method of producing a negative planographic printing plate according to claim 9, wherein said recording layer contains (A) an infrared absorbing agent, (B) a radical generator and (C) a radical-polymerizable compound which causes a polymerization reaction with the generated radical, said polymerization reaction causing hardening.

12. A method of producing a negative planographic printing plate according to claim 11, wherein said recording layer further contains (D) a binder polymer.

13. A method of producing a negative planographic printing plate according to claim 9, wherein the optical density of said recording layer is in a range from 0.6 to 1.6.

14. A method of producing a negative planographic printing plate according to claim 9, wherein the ratio of the film hardness of the upper part of said recording layer to the average film hardness is 1.2 or more.

15. A method of producing a negative planographic printing plate according to claim 11, wherein said infrared absorbing agent (A) is selected from the group consisting of cyanine colorants, squarylium colorants, pyrylium salts, and nickel thiolate complexes.

16. A method of producing a negative planographic printing plate according to claim 11, wherein said radical generator (B) is an onium salt.

17. A negative planographic printing plate precursor according to claim 1, wherein said recording layer comprises a sulfonium salt and a cyanine colorant that is represented by general formula (I):

General formula (I)

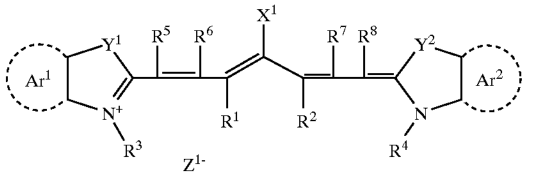

wherein the general formula (I), X1 represents a halogen atom or $X^2$—$L^1$ or $NL^2N^3$; $X^2$ represents an oxygen atom or sulfur atom; $L^1$ represents a hydrocarbon group having 1 to 12 carbon atoms; each of $L^2$ and $L^3$ independently represents a hydrocarbon group having 1 to 12 carbon atoms; each of $R^1$ and $R^2$ independently represents a hydrocarbon group having 1 to 12 carbon atoms; $Ar^1$ and $Ar^2$ may be the same or different, and represent an aromatic hydrocarbon group which may have a substituent; $Y^1$ and $Y^2$ may be the same or different, and represent a dialkylmethylene group having 12 or less sulfur atoms or carbon atoms; $R^3$ and $R^4$ may be the same or different, and represent a hydrocarbon group having 20 or less carbon atoms and which may have a substituent; $R^5$, $R^6$, $R^7$ and $R^8$ may be the same or different, and represent a hydrogen atom or a hydrocarbon group having 12 or less carbon atoms; $Z^{1-}$ represents a counter anion, however, when any of $R^1$ to $R^8$ is substituted with a sulfo group, $Z^{1-}$ is not necessary.

18. A method of producing a negative planographic printing plate precursor according to claim 9, wherein said recording layer comprises a sulfonium salt and a cyanine colorant that is represented by general formula (I):

General formula (I)

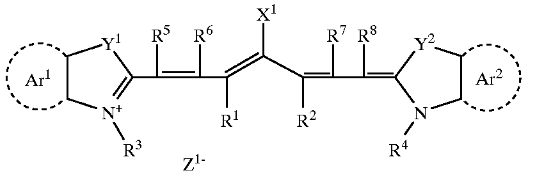

wherein the general formula (I), X1 represents a halogen atom or $X^2$—$L^1$ or $NL^2N^3$; $X^2$ represents an oxygen atom or sulfur atom; $L^1$ represents a hydrocarbon group having 1 to 12 carbon atoms; each of $L^2$ and $L^3$ independently represents a hydrocarbon group having 1 to 12 carbon atoms; each of $R^1$ and $R^2$ independently represents a hydrocarbon group having 1 to 12 carbon atoms; $Ar^1$ and $Ar^2$ may be the same or different, and represent an aromatic hydrocarbon group which may have a substituent; $Y^1$ and $Y^2$ may be the same or different, and represent a dialkylmethylene group having 12 or less sulfur atoms or carbon atoms; $R^3$ and $R^4$ may be the same or different, and represent a hydrocarbon group having 20 or less carbon atoms and which may have a substituent; $R^5$, $R^6$, $R^7$ and $R^8$ may be the same or different, and represent a hydrogen atom or a hydrocarbon group having 12 or less carbon atoms; $Z^{1-}$ represents a counter anion, however, when any of $R^1$ to $R^8$ is substituted with a sulfo group, $Z^{1-}$ is not necessary.

* * * * *